United States Patent
Wyatt

(10) Patent No.: US 11,971,616 B1
(45) Date of Patent: Apr. 30, 2024

(54) APPARATUS AND METHOD FOR CREATING HIGHLY-FUNCTIONAL META-MATERIALS FROM LUMINESCING NANOPARTICLES

(71) Applicant: PixelDisplay Inc., San Jose, CA (US)

(72) Inventor: David Wyatt, Austin, TX (US)

(73) Assignee: PixelDisplay Inc., San Jose, CA (US)

( * ) Notice: Subject to any disclaimer, the term of this patent is extended or adjusted under 35 U.S.C. 154(b) by 496 days.

(21) Appl. No.: 16/846,160

(22) Filed: Apr. 10, 2020

Related U.S. Application Data

(60) Provisional application No. 62/832,792, filed on Apr. 11, 2019, provisional application No. 62/832,498, filed on Apr. 11, 2019.

(51) Int. Cl.
| | |
|---|---|
| *G02F 1/01* | (2006.01) |
| *C09K 11/00* | (2006.01) |
| *G02B 5/20* | (2006.01) |
| *G03F 7/09* | (2006.01) |
| *B82Y 20/00* | (2011.01) |
| *B82Y 40/00* | (2011.01) |

(52) U.S. Cl.
CPC .............. *G02F 1/01* (2013.01); *C09K 11/00* (2013.01); *G02B 5/208* (2013.01); *G03F 7/091* (2013.01); *B82Y 20/00* (2013.01); *B82Y 40/00* (2013.01); *G02F 2202/30* (2013.01)

(58) Field of Classification Search
CPC ........ G02F 1/0009; G02F 1/01; G02F 1/0102; G02F 1/015
See application file for complete search history.

(56) References Cited

U.S. PATENT DOCUMENTS

| | | | |
|---|---|---|---|
| 2006/0007791 A1* | 1/2006 | Bamdad | G02F 1/0128 369/100 |
| 2014/0057375 A1* | 2/2014 | Miller | H01L 33/508 257/E33.061 |

(Continued)

OTHER PUBLICATIONS

Caseri, Color switching in nanocomposites comprising inorganic nanoparticles dispersed in a polymer matrix, J. Mater. Chem., 2010, 20, 5582-5592 (Year: 2010).*

(Continued)

*Primary Examiner* — Hoa (Holly) Le

(57) ABSTRACT

Presented herein are methods for creating nanoparticles, which exhibit desirable electro-luminescent and photo-luminescent capabilities, while retaining the robust inorganic nature. And incorporating the nanoparticles in micron and sub-micron scale structures, via a range of patterning techniques, to create highly functional meta-material apparatus. Example embodiments include applications in emissive color elements within displays, Micro-LED devices, and thin-film apparatus; integrating optical, photonic and plasmonic properties, from the combination of patternable nanoscale features, with photo/electro-luminescing material capabilities; performing multiple light processing functions, within the apparatus. The method of construction, materials, electrical drive, color and pixel manipulation as well as system integration are described, such that one of ordinary skill in the art could construct implementations including lighting, displays, panels and other applications.

20 Claims, 27 Drawing Sheets

ELECTRO-LUMINESCENT DISPLAY BASED ON BLUE AND RED-GREEN EXCITED BY CYAN

(56) References Cited

U.S. PATENT DOCUMENTS

2018/0348577 A1\* 12/2018 Pousthomis ...... G02F 1/133514
2019/0284473 A1\* 9/2019 Jain ..................... C09K 11/623

OTHER PUBLICATIONS

Becker et al., Nanophotonic enhanced two-photon excited photoluminescence of perovskite quantum dots, ACS Photonics 2018 5 (11), 4668-4676 (Year: 2018).\*
Becker et al, Nanophotonic enhanced two-photon excited photoluminescence of perovskite quantum dots (Year: 2012).\*

\* cited by examiner

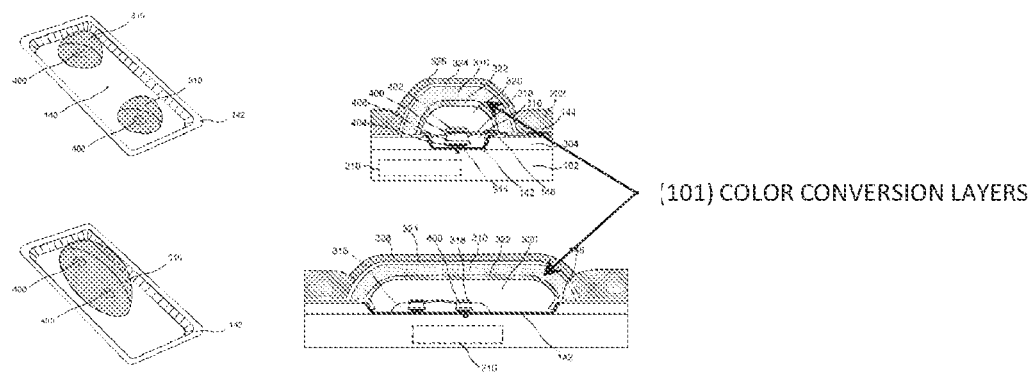
FIGURE 1 – PRIOR ART MICROLED (TYPE A) WITH COLOR CONVERSION LAYERS
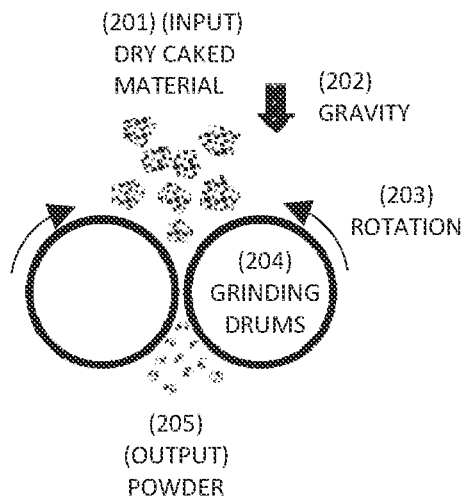
FIGURE 2 – TYPICAL PHOSPHOR GRINDING PROCESS
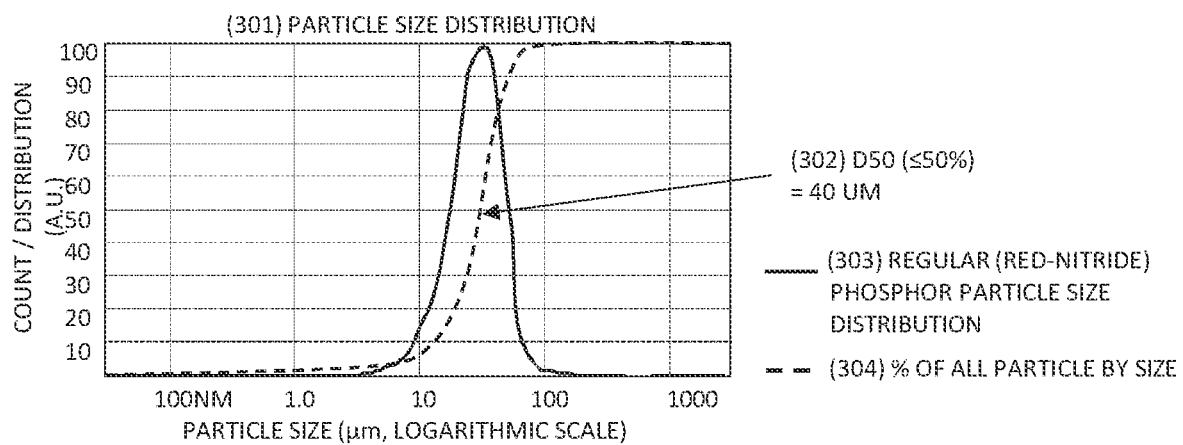
FIGURE 3 – TYPICAL (NITRIDE) PHOSPHOR PARTICLES, THE D50 AVERAGE PARTICLE SIZE IS ≤40UM

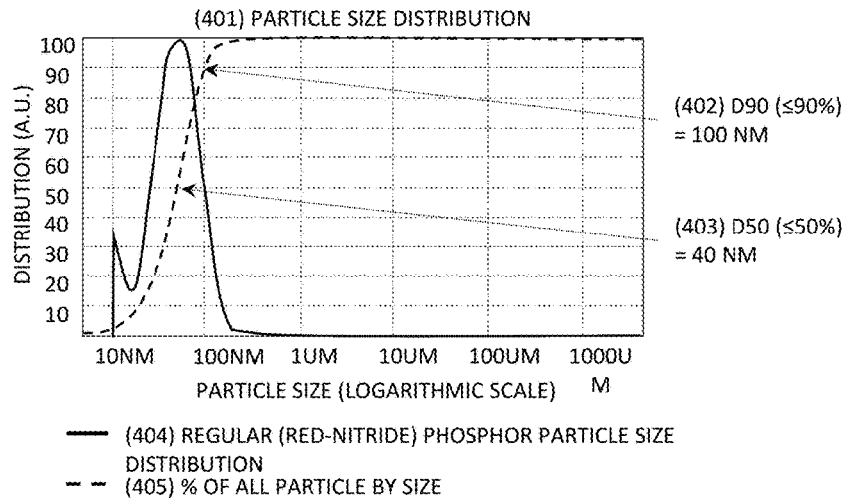
FIGURE 4 – ANALYSIS OF THE NANOPARTICLES FROM THE DESCRIBED METHODS, WITH D90 (MAJORITY) SIZE LESS THAN 100NM
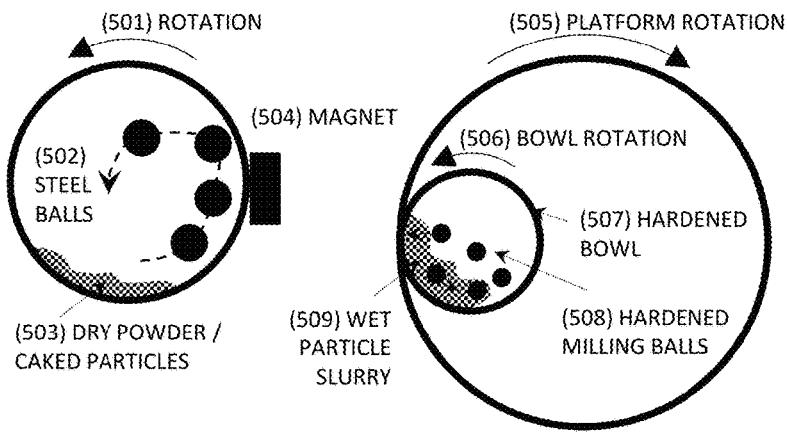
FIGURE 5 – EXAMPLE HIGH-SPEED BALL MILLING PROCESSES

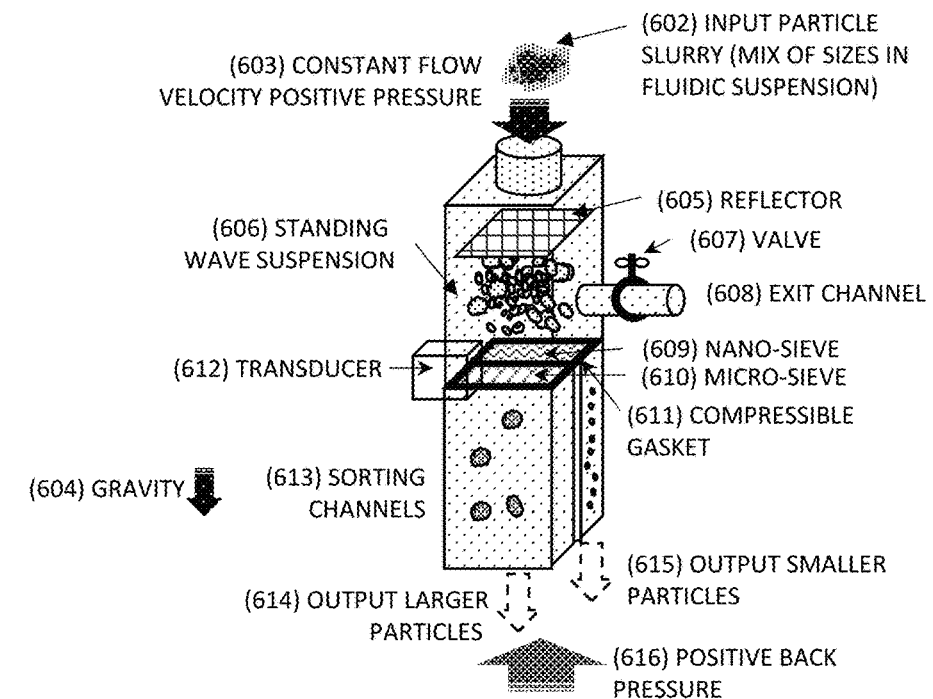
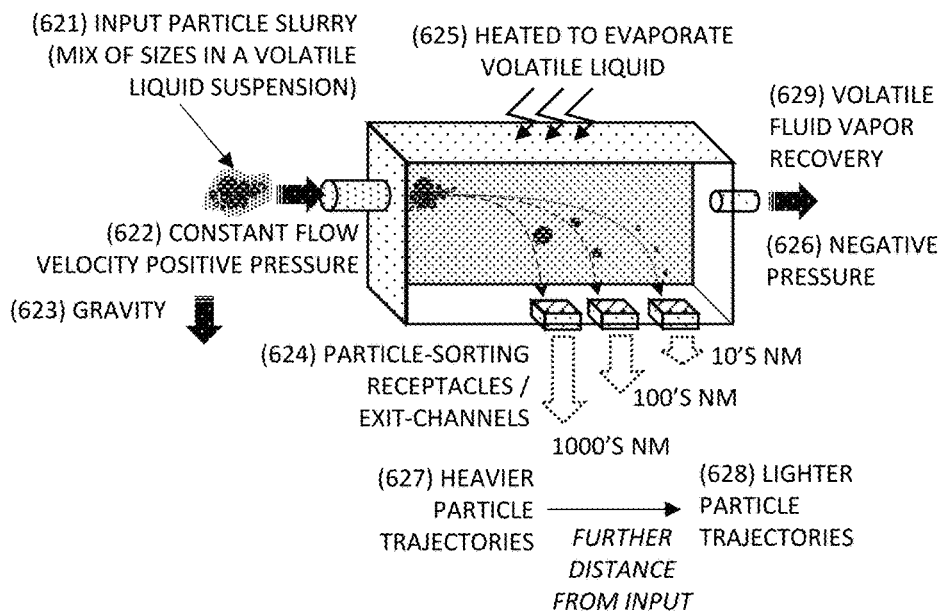
FIGURE 6 – BULK NANOPARTICLE SORTING APPARATUS

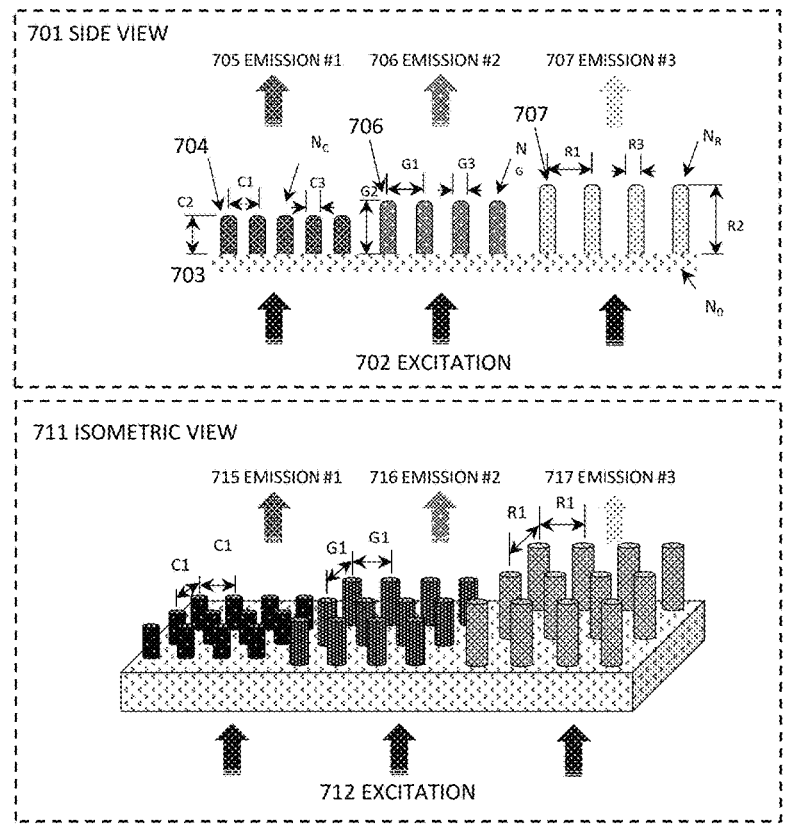
FIGURE 7 – A PHASE ARRAY COLOR FILTER FORMED FROM AN WAVEGUIDE ARRANGED OUT OF FUNCTIONAL NANOPARTICLES
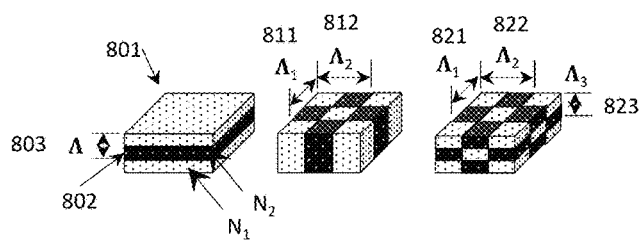
FIGURE 8 – 1D, 2D & 3D BRAGG DIFFRACTION STRUCTURES FROM ALTERNATING REFRACTIVE INDEX MATERIALS (N1, N2)

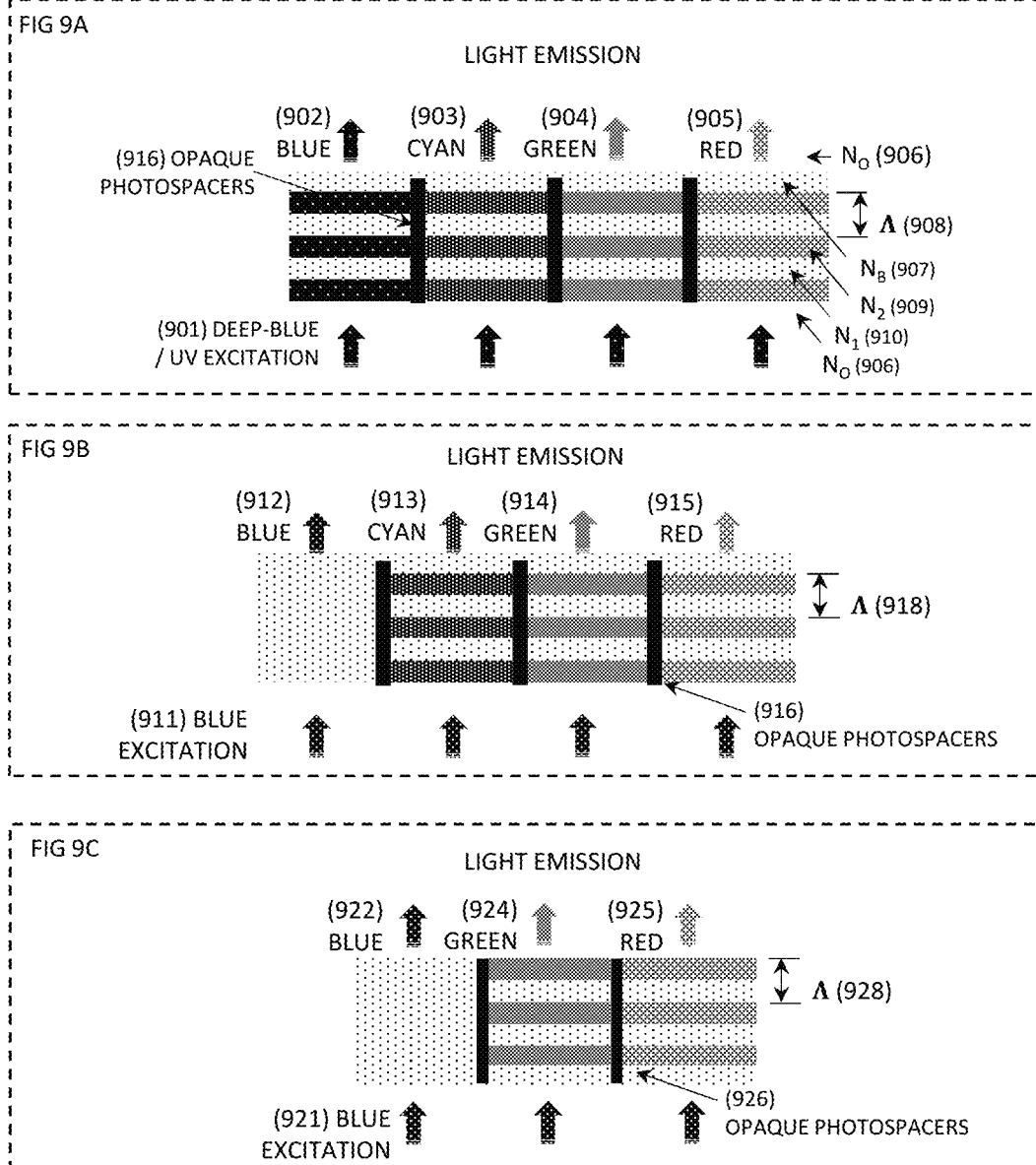
FIGURE 9 – A BRAGG REFLECTOR FORMED FROM FUNCTIONAL NANOPARTICLE LAYERS

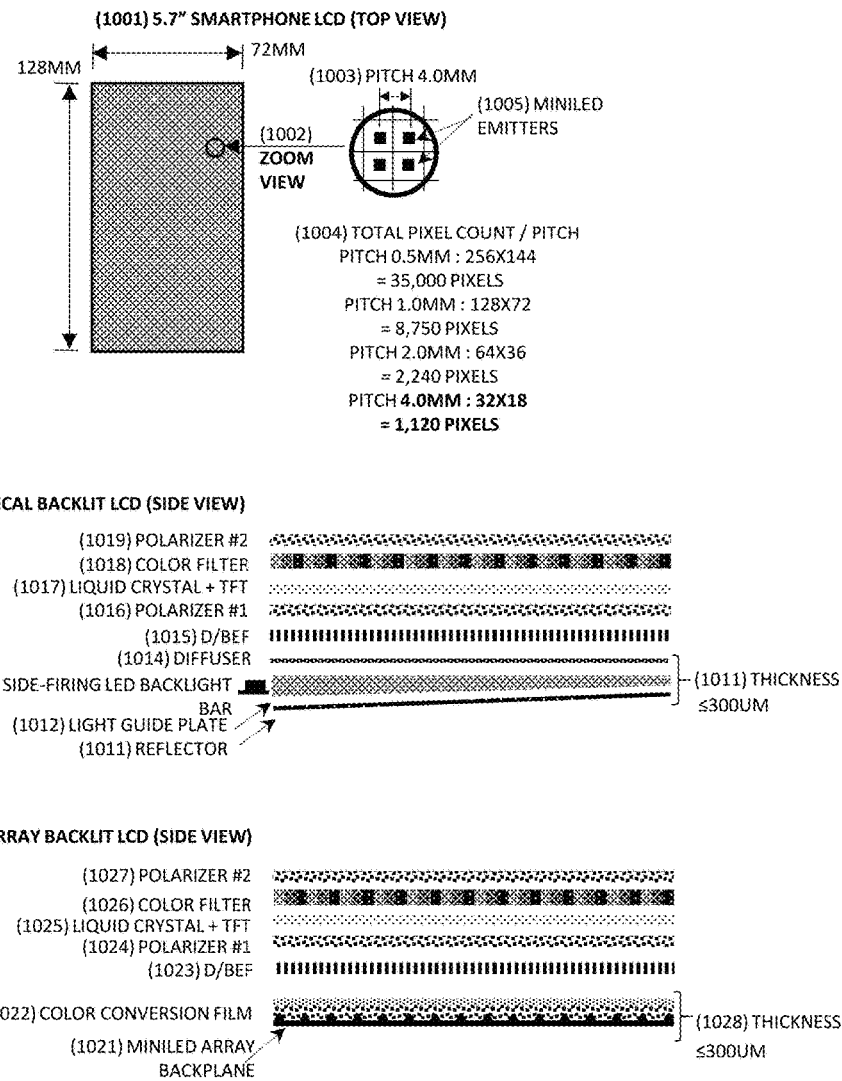
FIGURE 10 – MINILED BACKLIGHT ASSEMBLY LEVERAGING NANOPARTICLE FUNCTIONAL COLOR CONVERSION LAYER

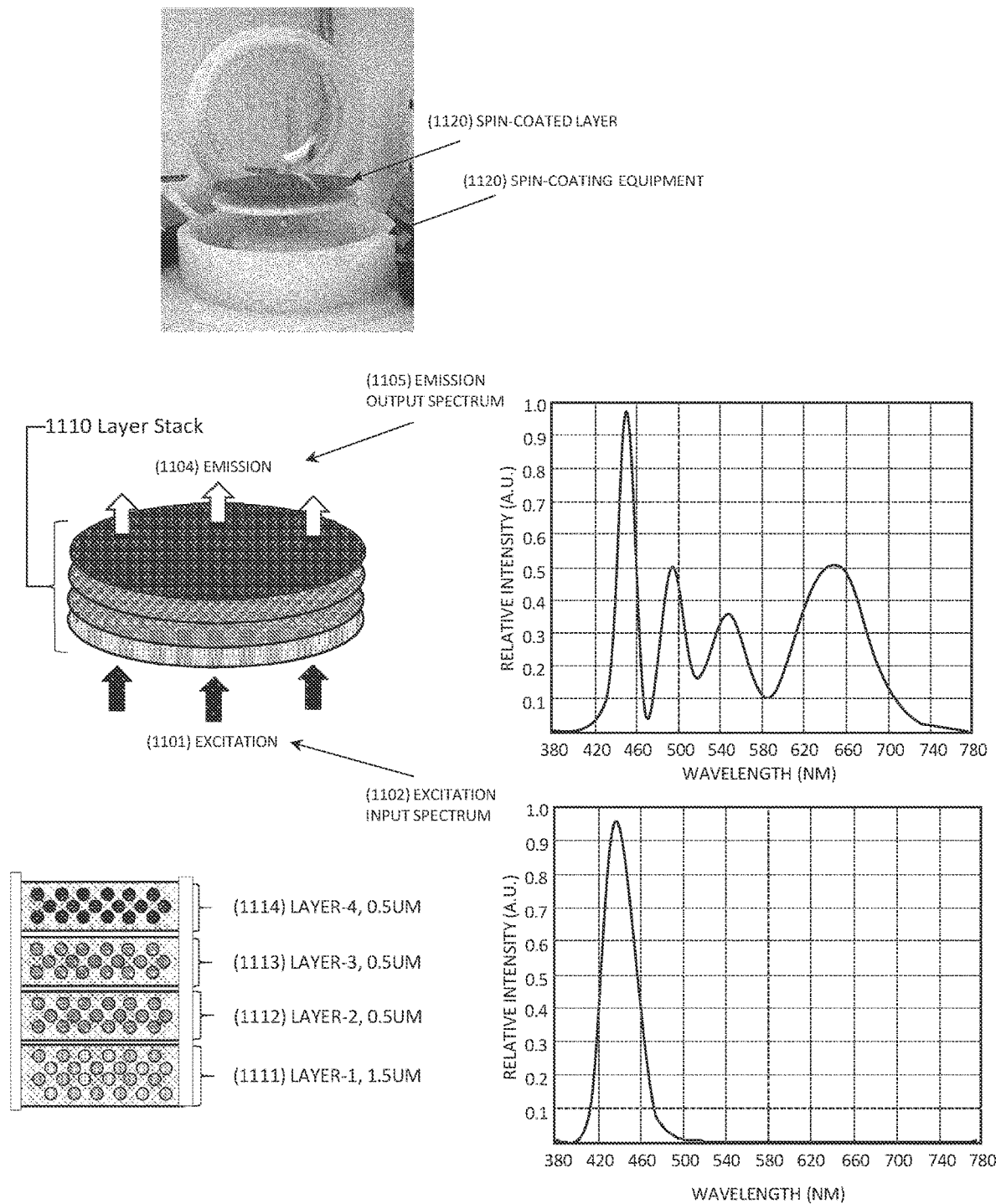
FIGURE 11 – STACKED SPIN-COATED SUBSTRATES

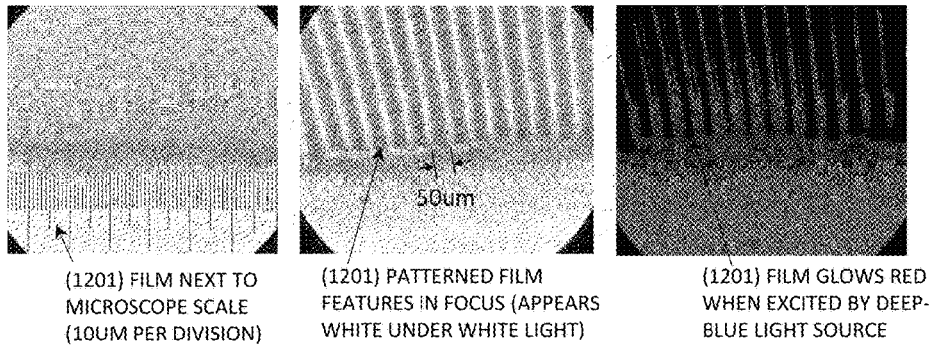
FIGURE 12 – MICROSCOPE VIEWS OF NANOPATTERNED OPTICAL FILM, USING RED NANOPARTICLE IN SU-8
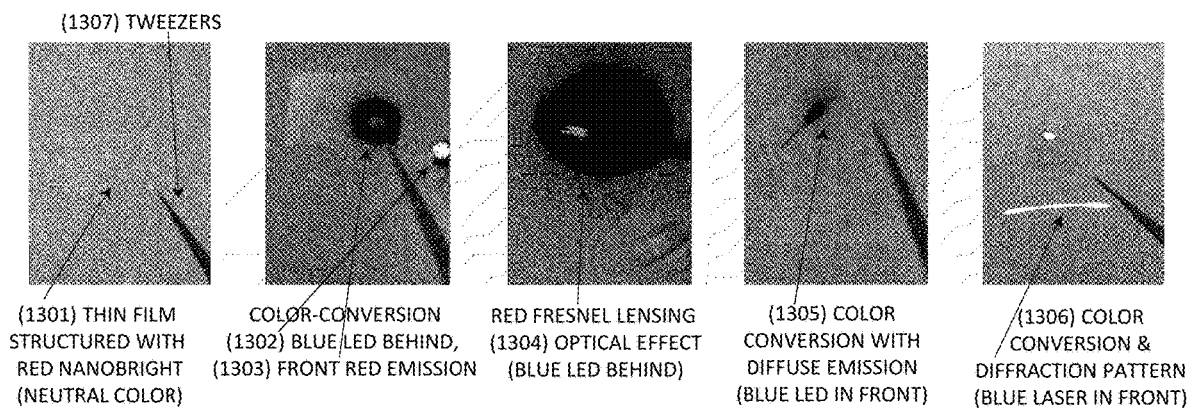
FIGURE 13 – NANOPATTERNED OPTICAL FILM, USING RED NANOBRIGHT NANOPARTICLE IN SU-8 PHOTO RESIST
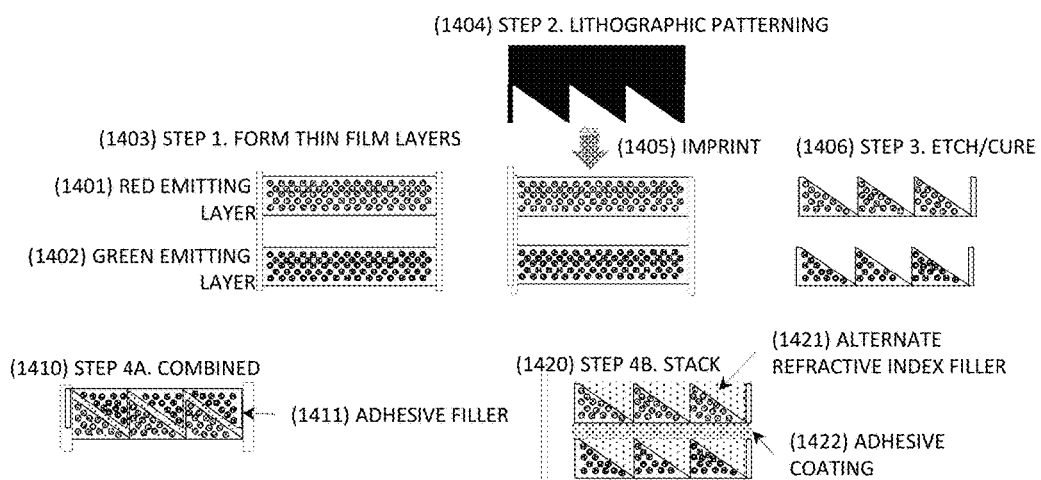
FIGURE 14 – PATTERNED FILM INCORPORATING NANOPARTICLE PARTICLES

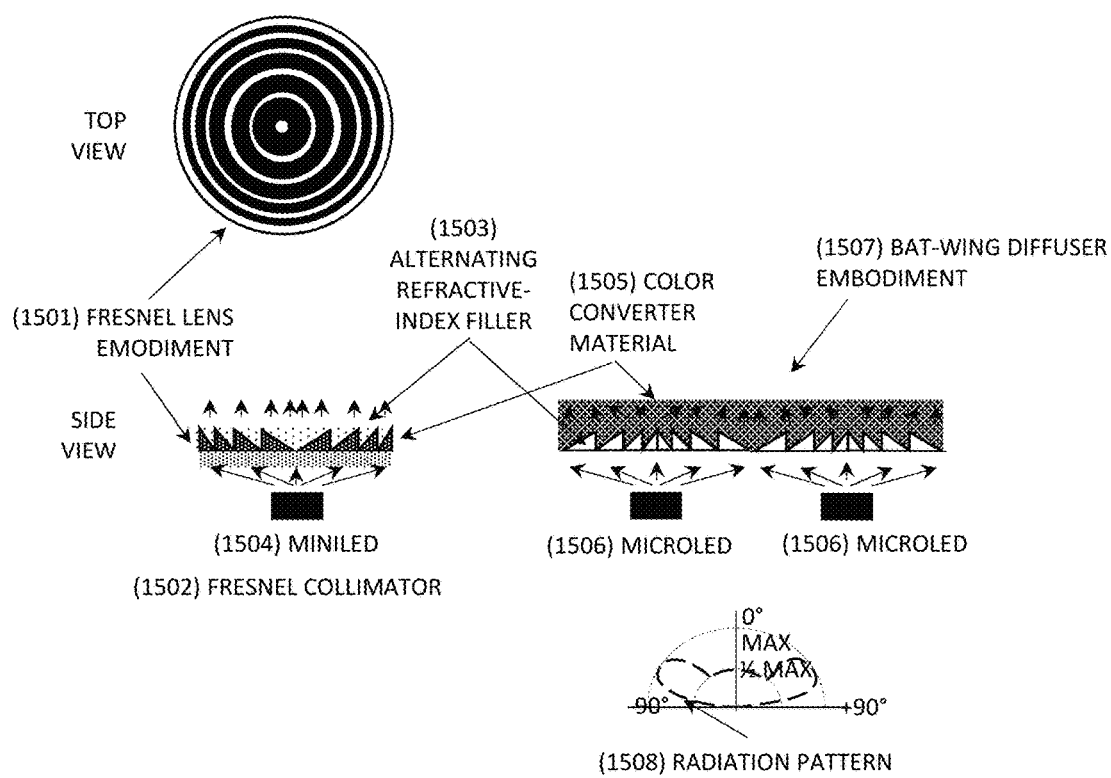
FIGURE 15 – FUNCTIONAL NANOPATTERNED FILM LAYERS IN FRESNEL LENS AND BATWING DIFFUSER EXAMPLES

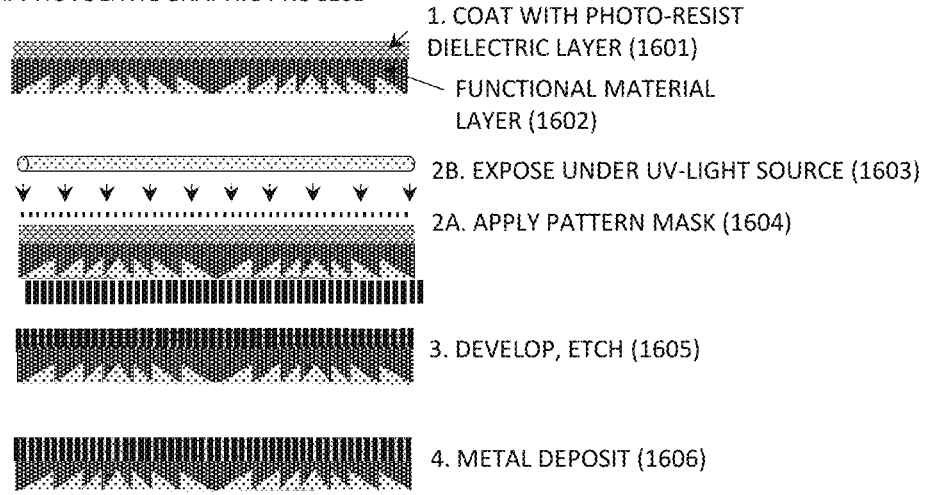
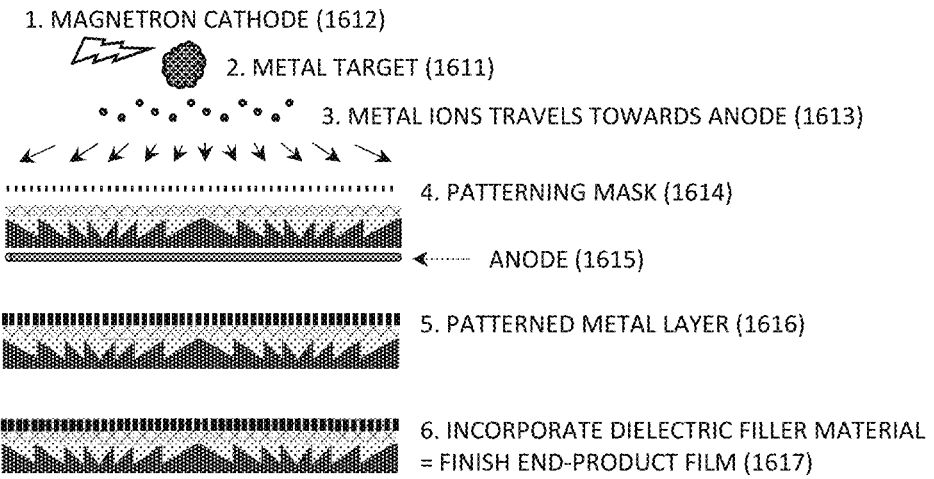
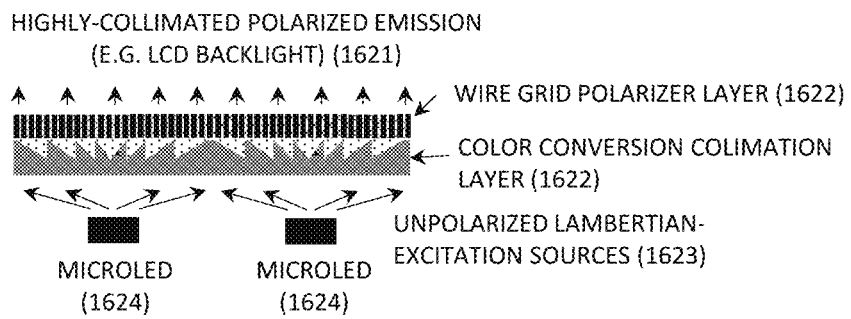
FIGURE 16 – PROCESSES FOR CREATING FUNCTIONAL NANOPATTERNED FILM LAYERS

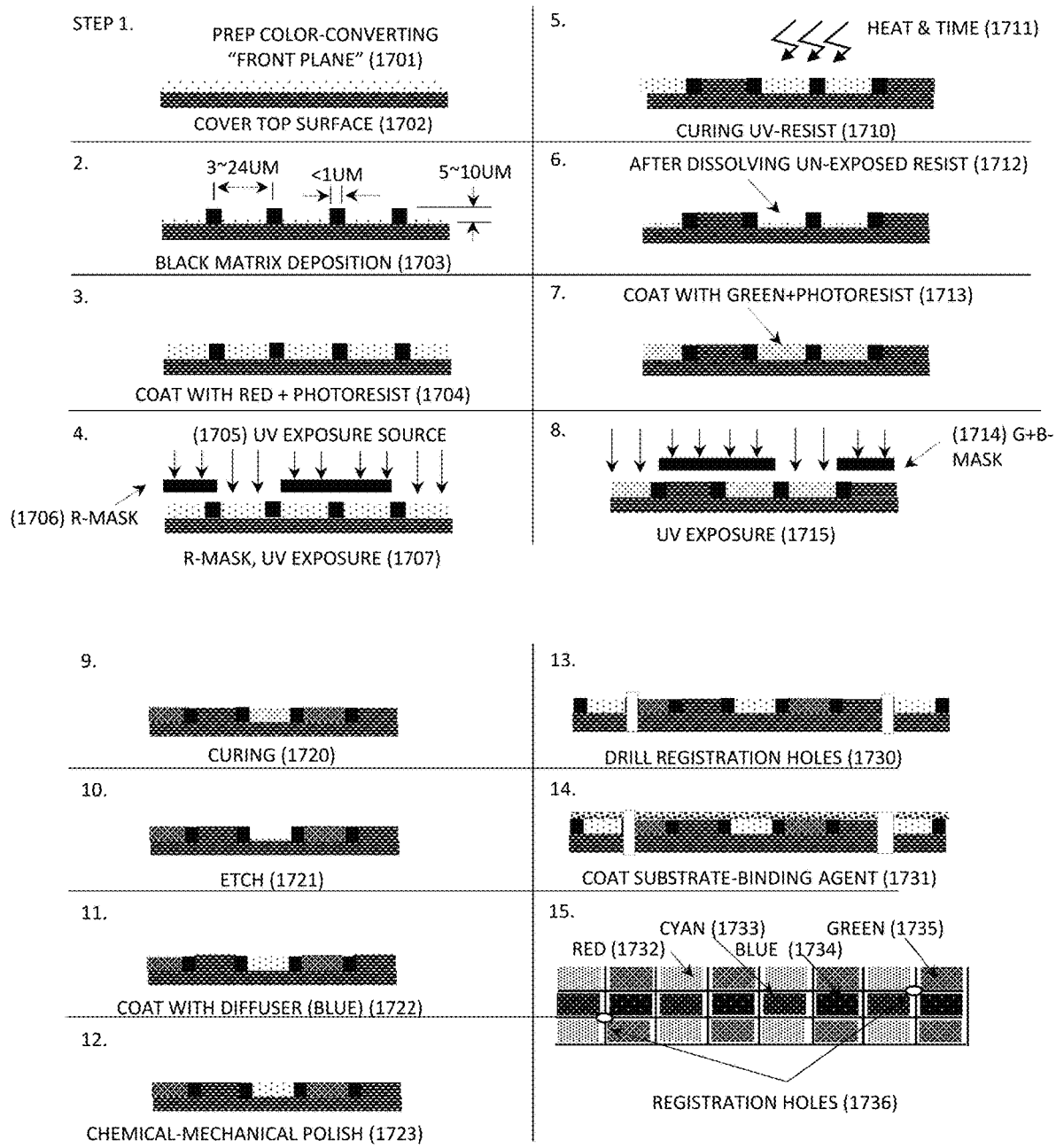
FIGURE 17 – PATTERNING ON COVER SUBSTRATE (THE "FRONT PLANE")

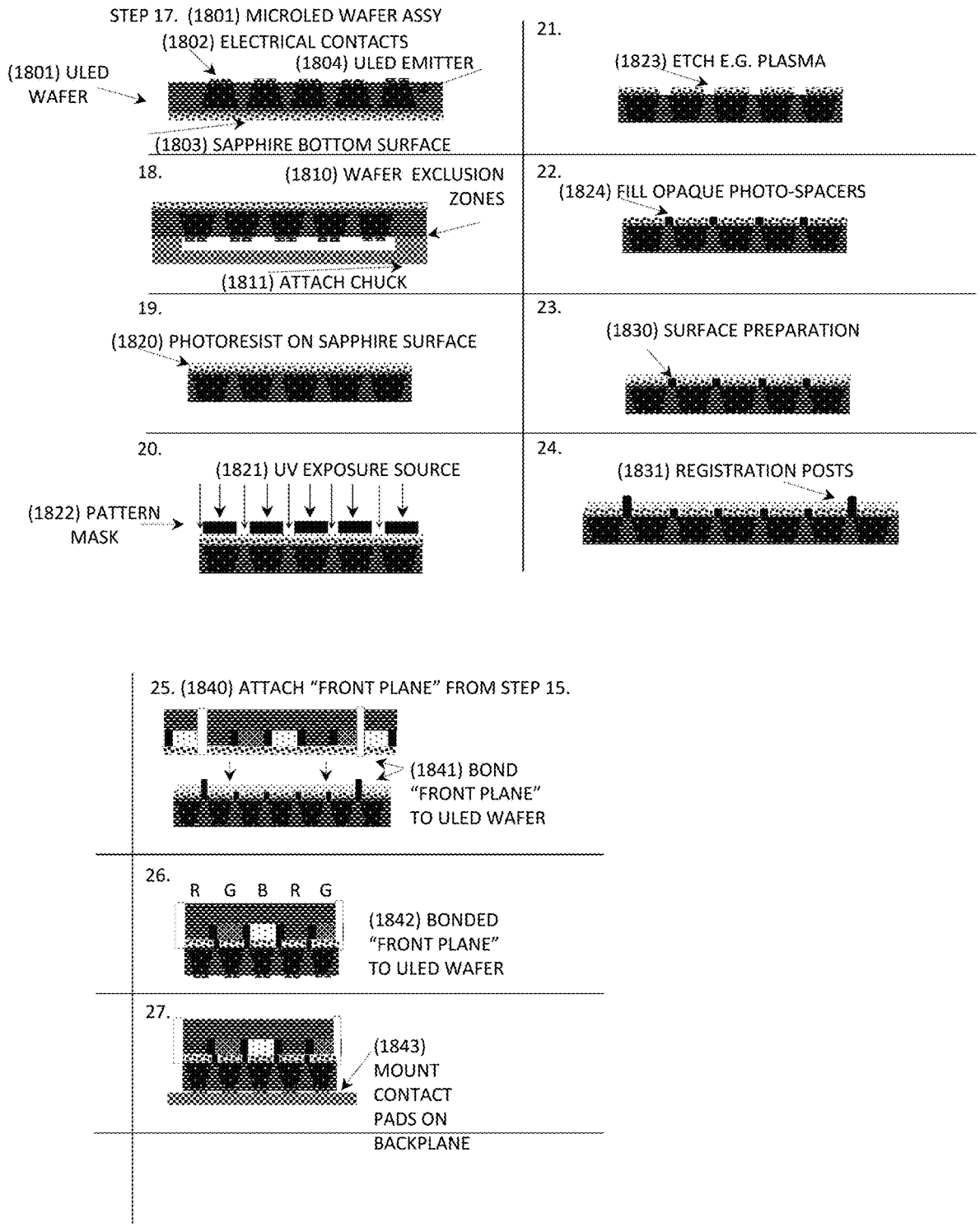
FIGURE 18 – MOUNTING THE PATTERNED LAYER ON THE MICROLED

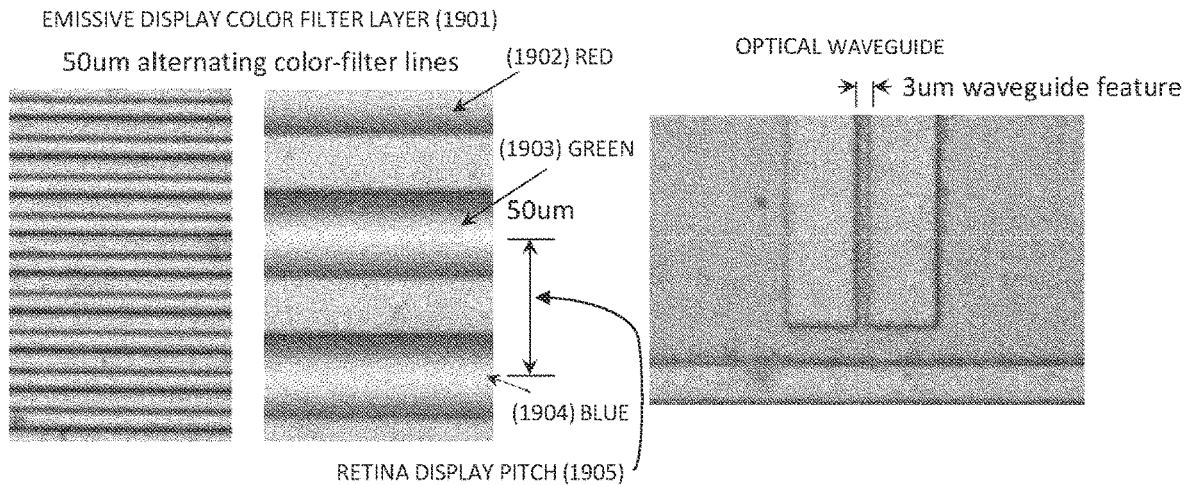
FIGURE 19 – REDUCED TO PRACTICE. FILMS NANOPATTERNED WITH (VIVIDCOLOR NANOBRIGHT) NANOPARTICLE MATERIALS
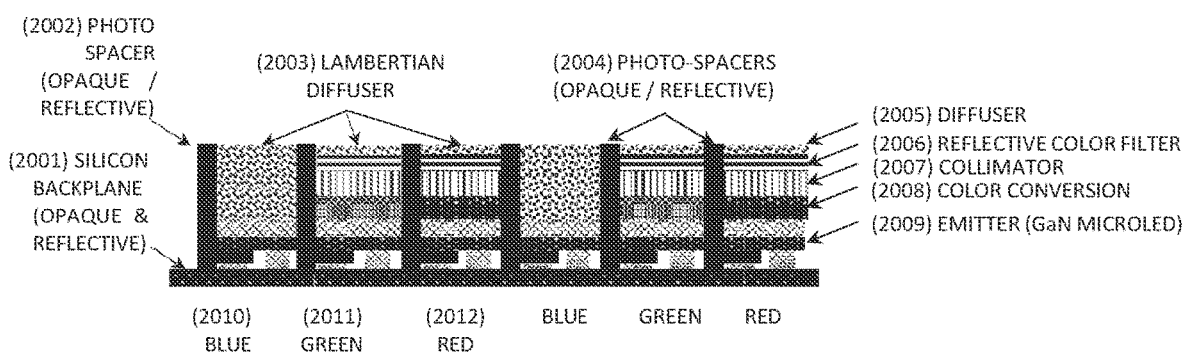
FIGURE 20 – HIGHLY FUNCTIONAL LAYERS FROM NANOPATTERNED MATERIALS

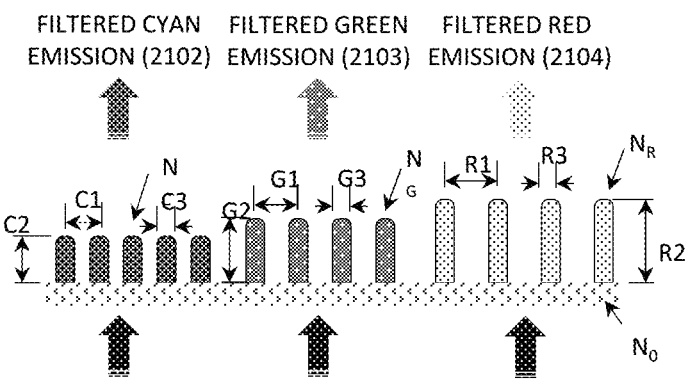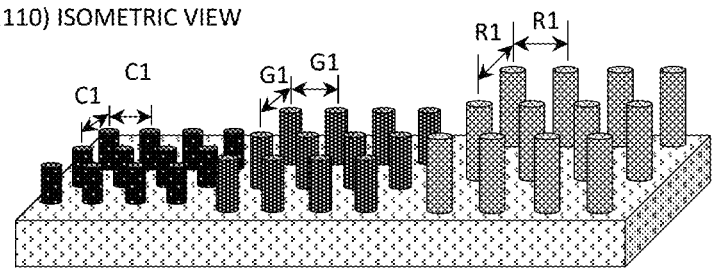
FIGURE 21 – NANOPATTERNED HIGHLY FUNCTIONAL FILM USING NANOMATERIALS

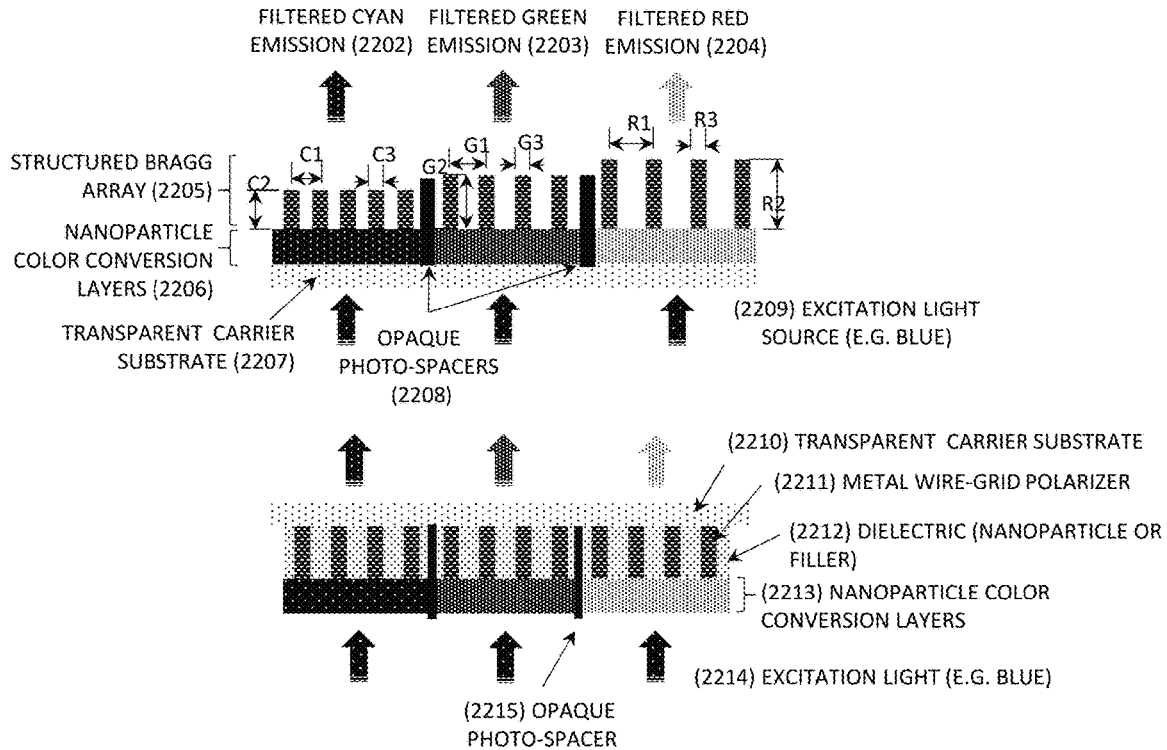
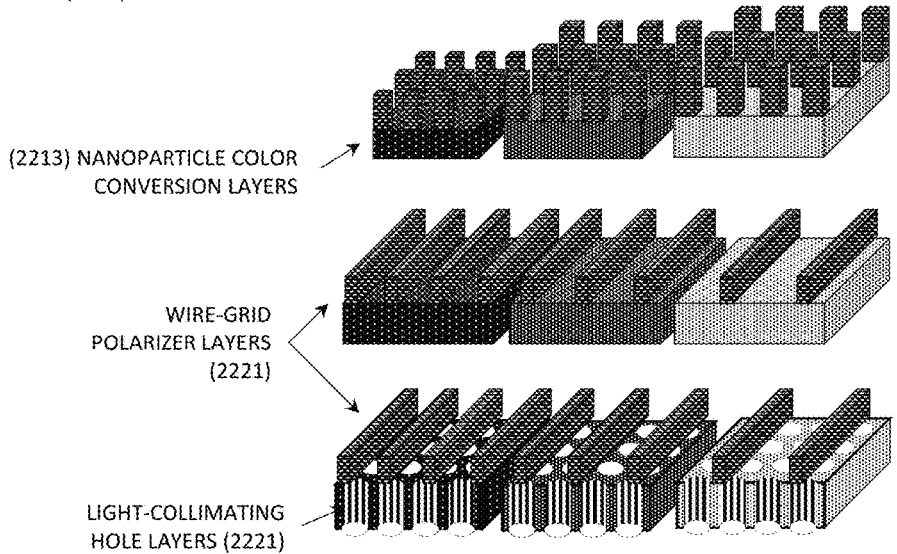
FIGURE 22 – ASSEMBLY WITH NANOPATTERNED FILTER/POLARIZER/COLLIMATOR USING PATTERNED COLOR-PARTICLES

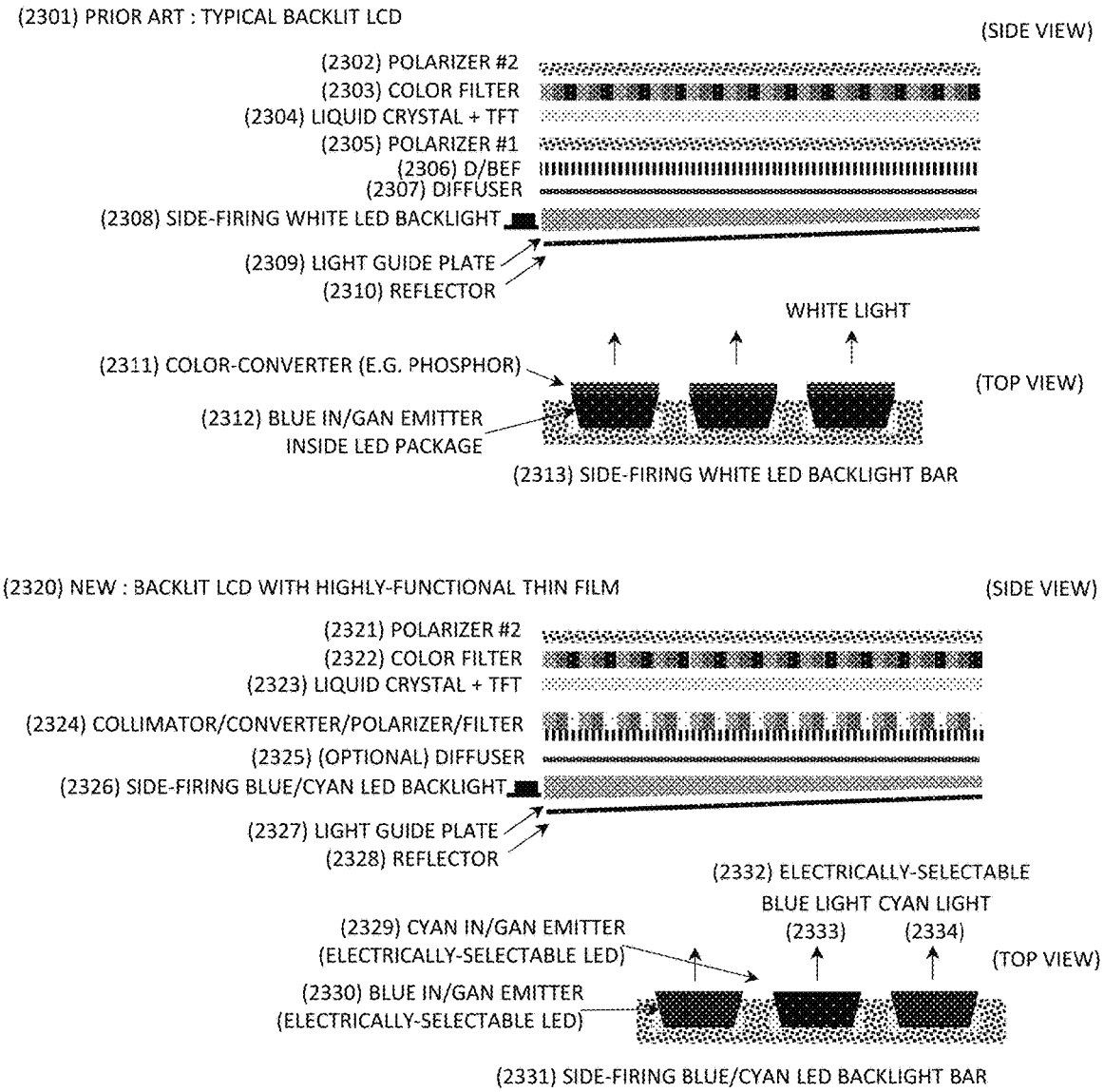
FIGURE 23 – DISPLAY WITH NANOPATTERNED EMISSIVE WAVEGUIDE FILTER/POLARIZER/COLLIMATOR LAYER

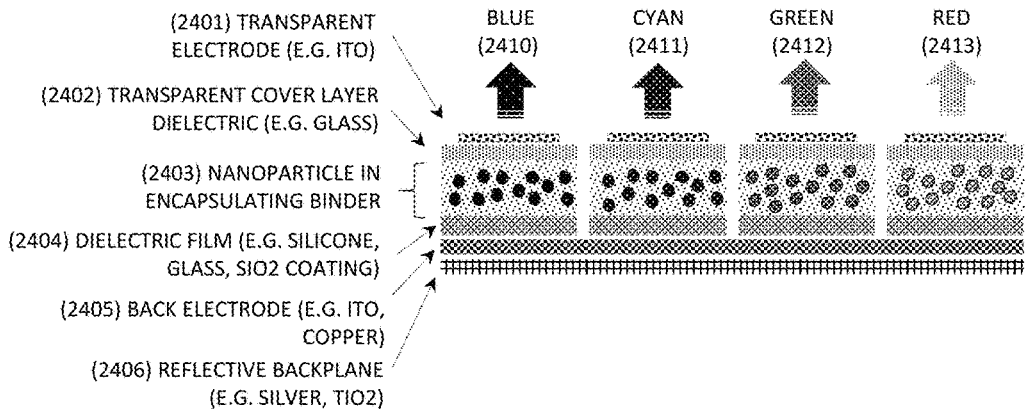
FIGURE 24 – ELECTRO-LUMINESCENT DISPLAY BASED ON CYAN AND OPTIONAL BLUE
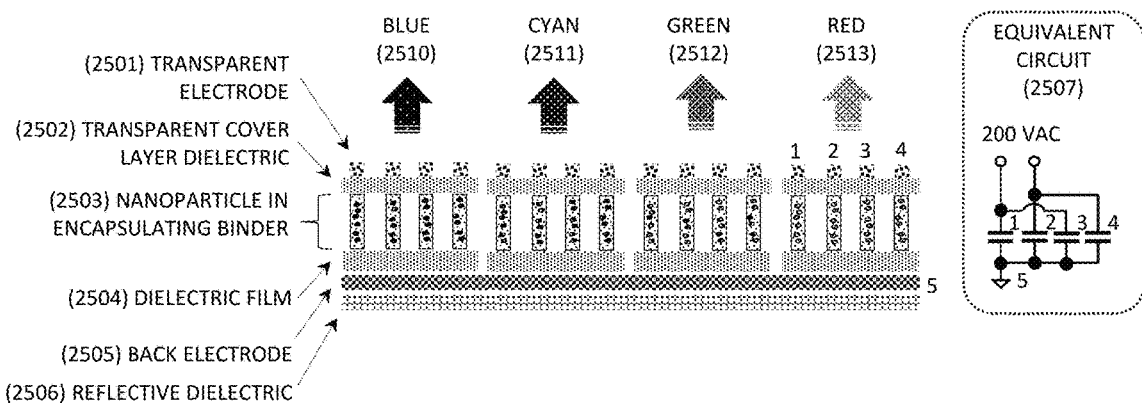
FIGURE 25 – ELECTRO-LUMINESCENT DISPLAY BASED ON CYAN AND OPTIONAL BLUE
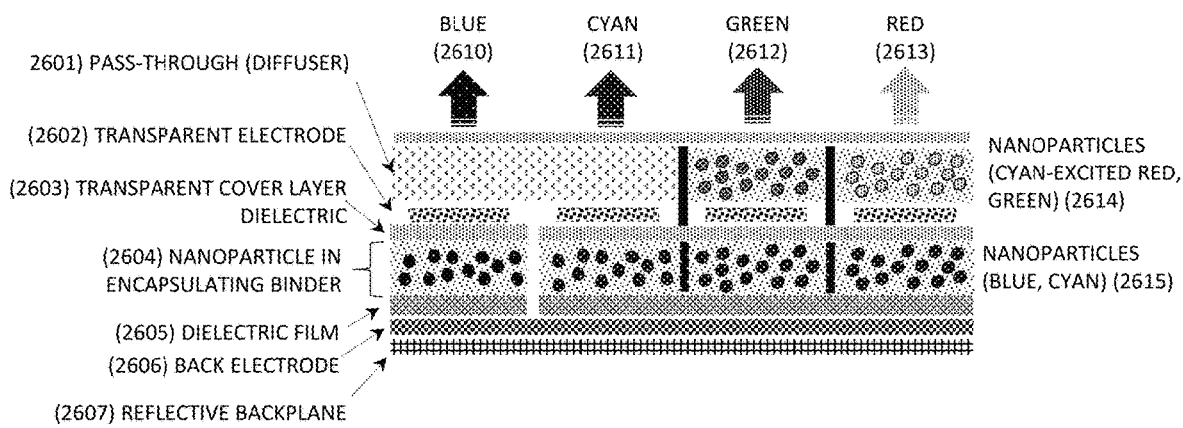
FIGURE 26 – ELECTRO-LUMINESCENT DISPLAY BASED ON BLUE AND RED-GREEN EXCITED BY CYAN

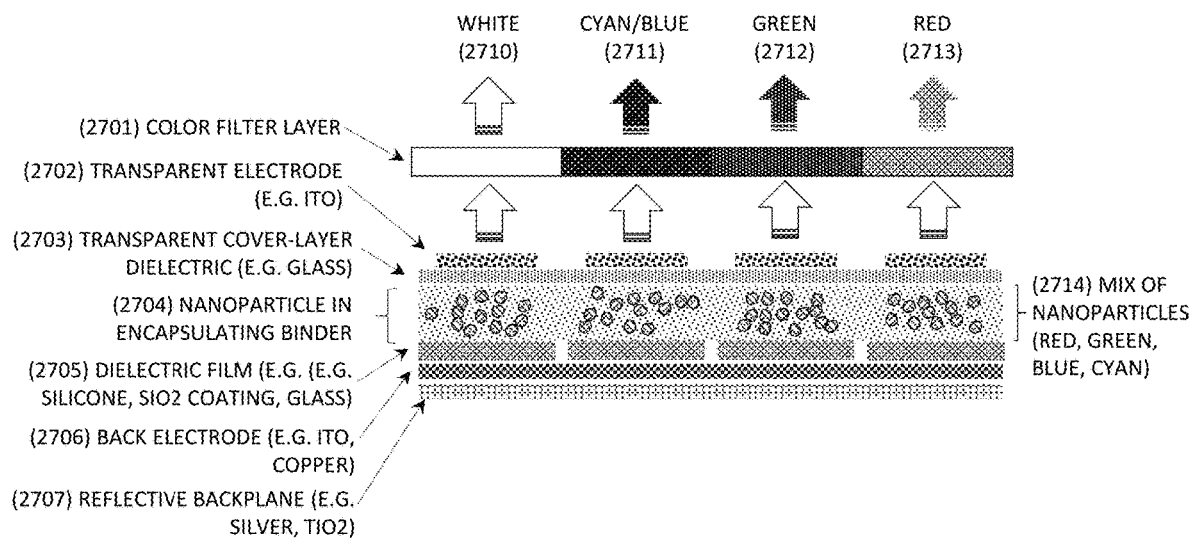
FIGURE 27 – ELECTRO-LUMINESCENT DISPLAY BASED ON MULTI-SPECTRAL NANOPARTICLE EXCITATIONS
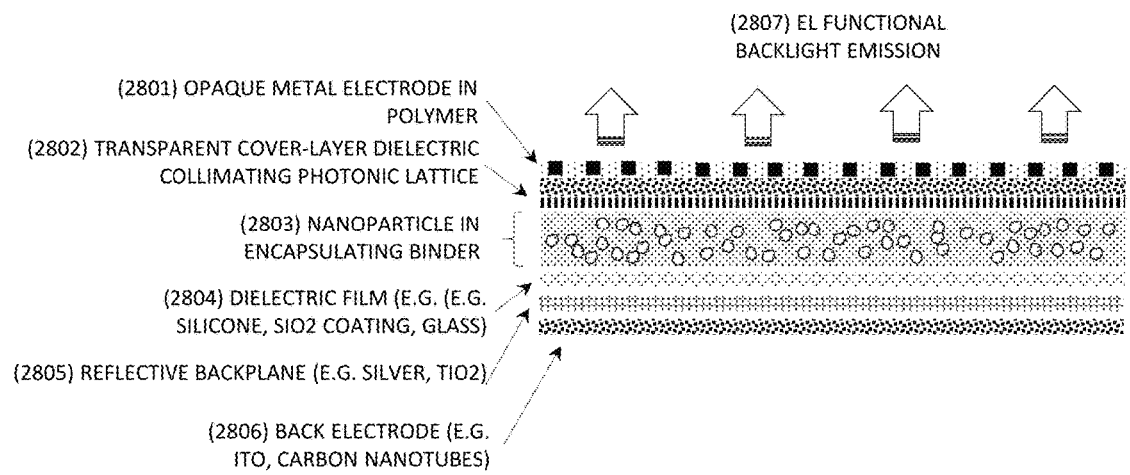
FIGURE 28 – HIGH FUNCTIONALITY ELECTRO-LUMINESCENT DISPLAY BACKLIGHT

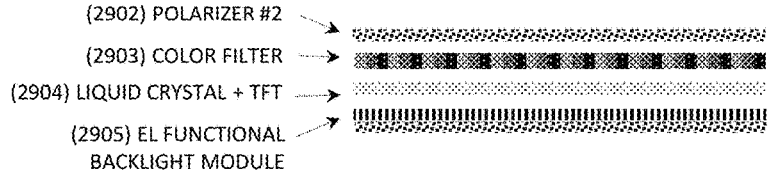
FIGURE 29 – HIGH FUNCTIONALITY FILM-STACK. ELECTRO-LUMINESCENT DISPLAY BACKLIGHT
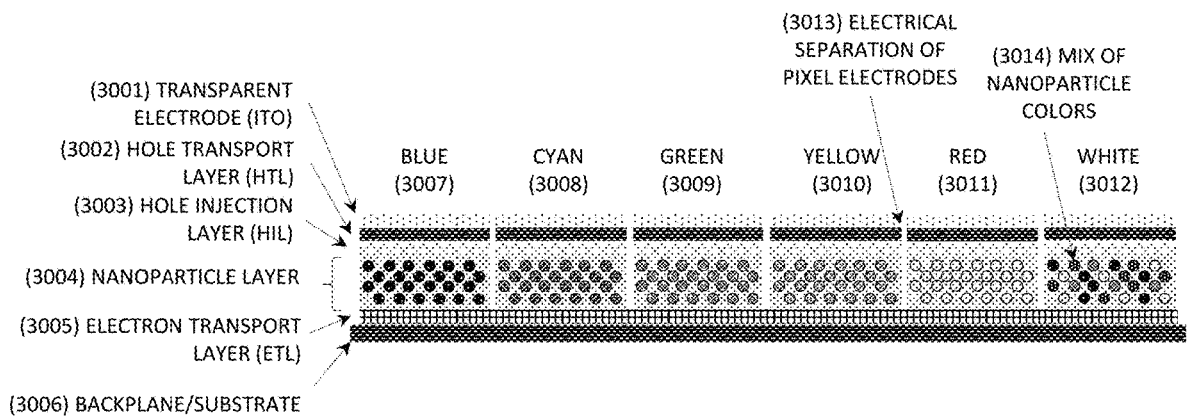
FIGURE 30 – ELECTROLUMINESCENT NP-LED PIXEL WITH B-C-G-Y-R-W SUB-ELEMENTS
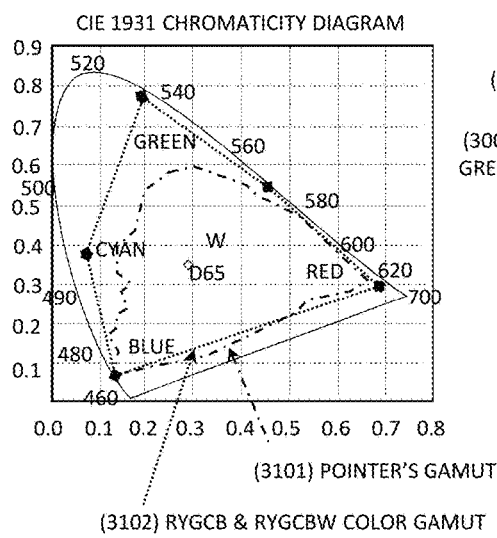
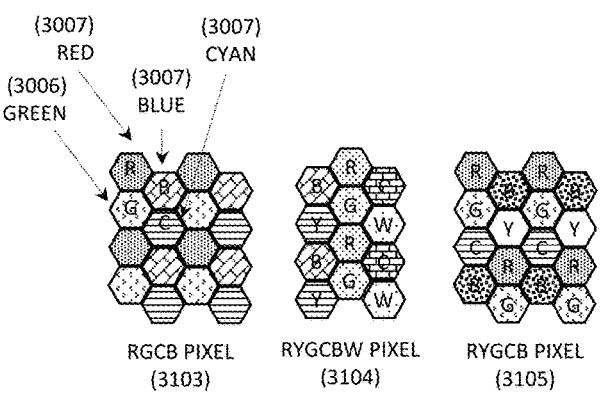
FIGURE 31 – SQUARE AND HEXAGONAL SUB-PIXEL STRUCTURE NP-LED

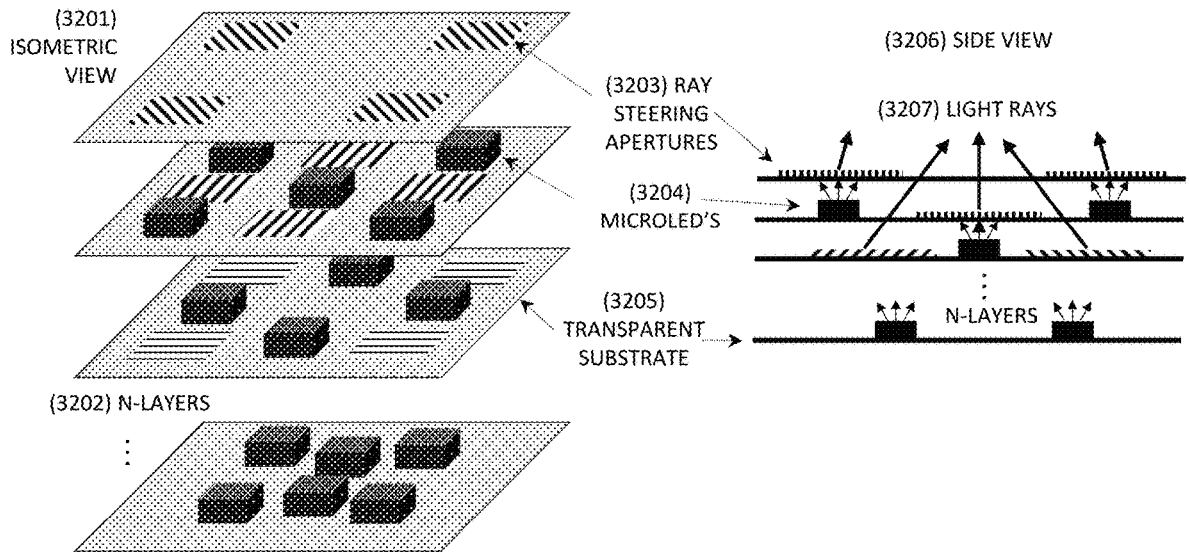
FIGURE 32 – MULTI-LAYER DEPTH MODULATING MICROLED WITH FUNCTIONAL RAY STEERING SURFACE STRUCTURES
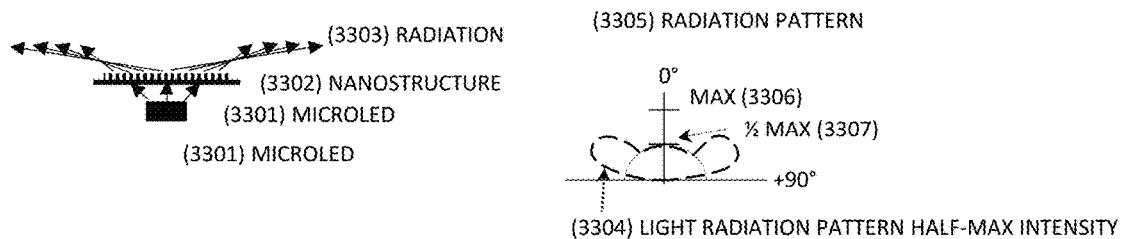
FIGURE 33 – BATWING DIFFUSER ON MICROLED
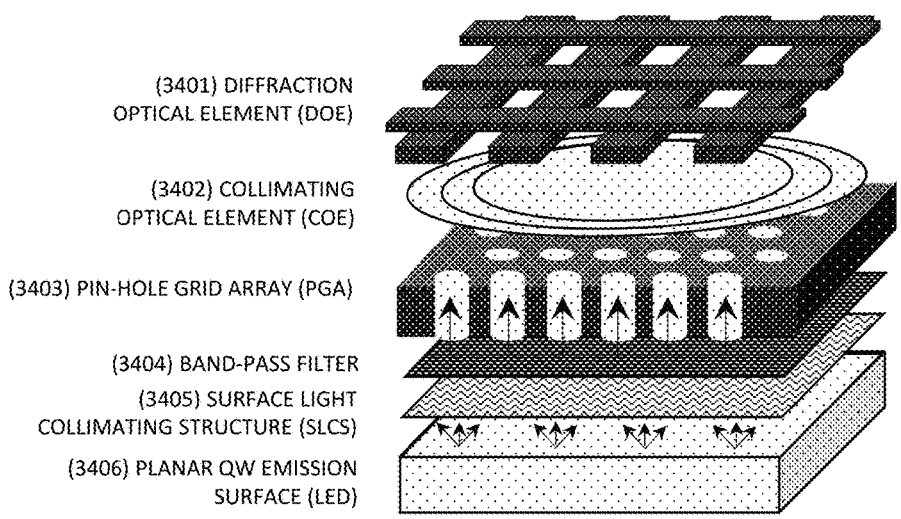
FIGURE 34 – LED 3D LIGHT PROJECTOR AND SLCS (RIGHT) SURFACE LIGHT COLLIMATING STRUCTURE

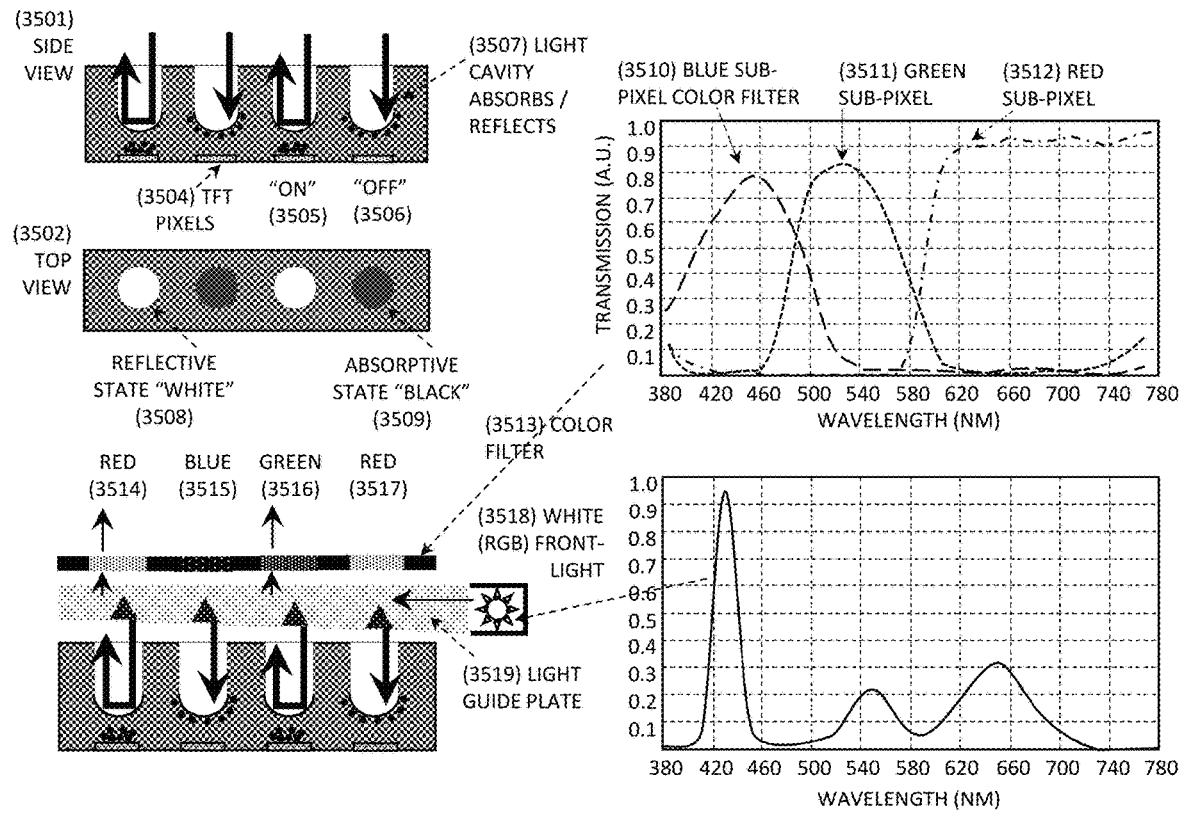
FIGURE 35 – PRIOR ART EPAPER DISPLAY, TFT FIELD MOVES PARTICLES THAT INTERFERE USING TOTAL INTERNAL REFLECTION
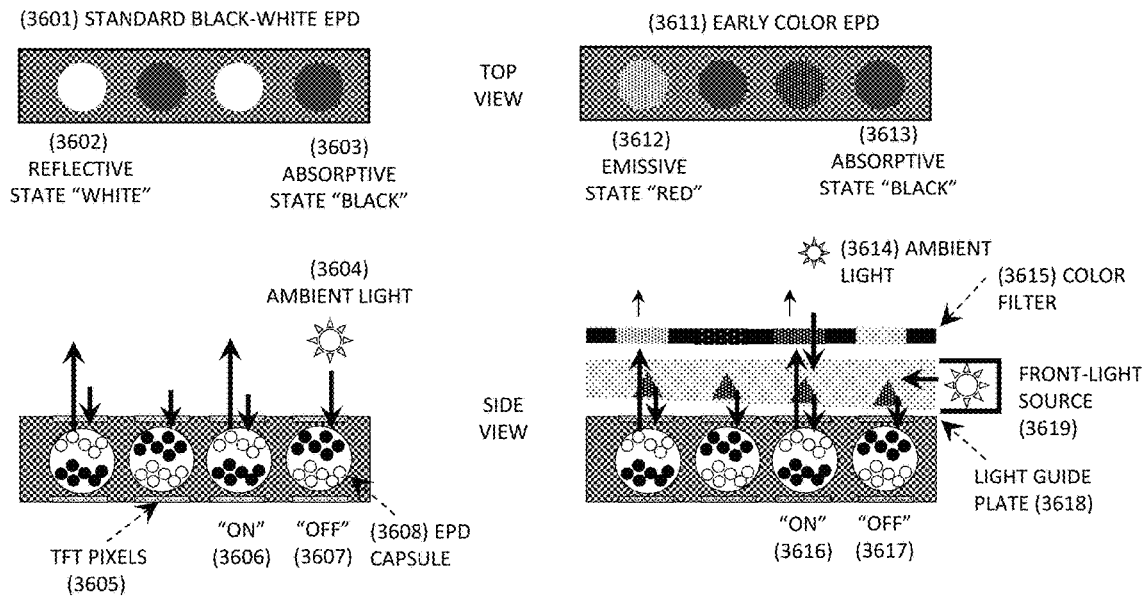
FIGURE 36 – PRIOR ART ELECTROPHORETIC DISPLAY (EPD) EPAPER BASED ON MOVING MONOCHROMATIC (LIGHT-ABSORBING/REFLECTING) INK PARTICLES IN A MICROCAPSULE IN AN ELECTRIC FIELD

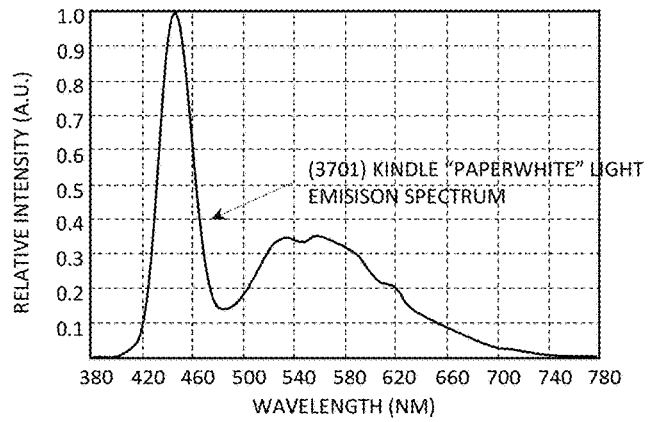
FIGURE 37 – ELECTROPHORETIC EPAPER DISPLAY WITH YAG WHITE LED
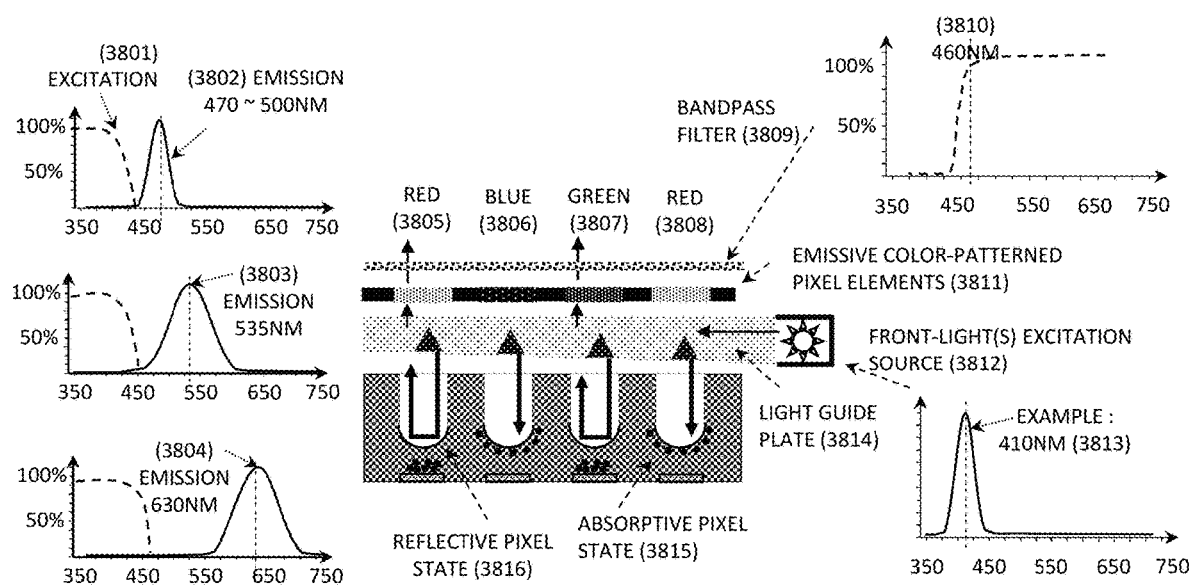
FIGURE 38 – EYE-SAFE FRONTLIT EMISSIVE (TIR) EPAPER COLOR DISPLAY (WITHOUT AMBIENT LIGHT FILTER)

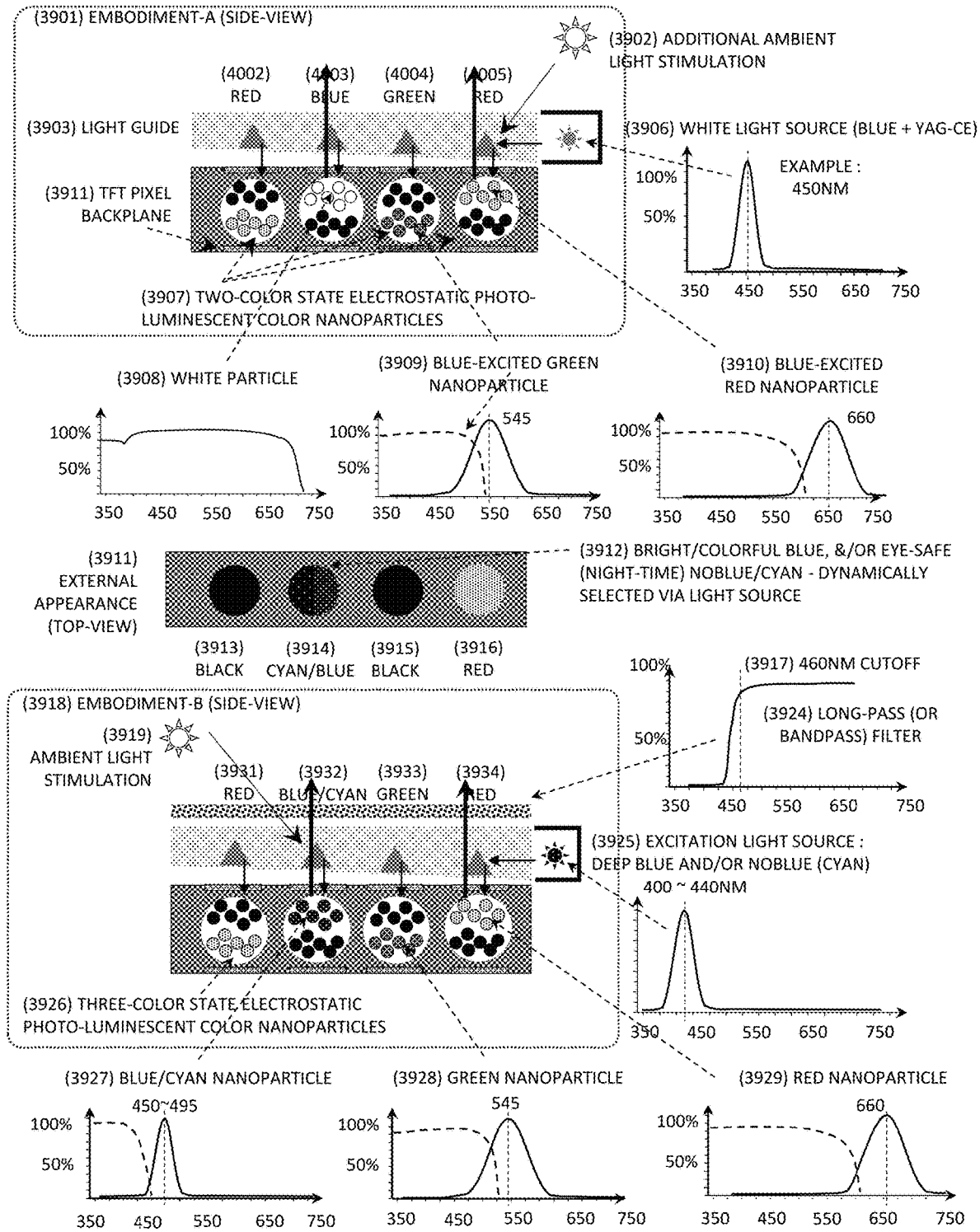
FIGURE 39 – NANOPARTICLE IN ELECTROPHORETIC DISPLAY CONFIGURATION

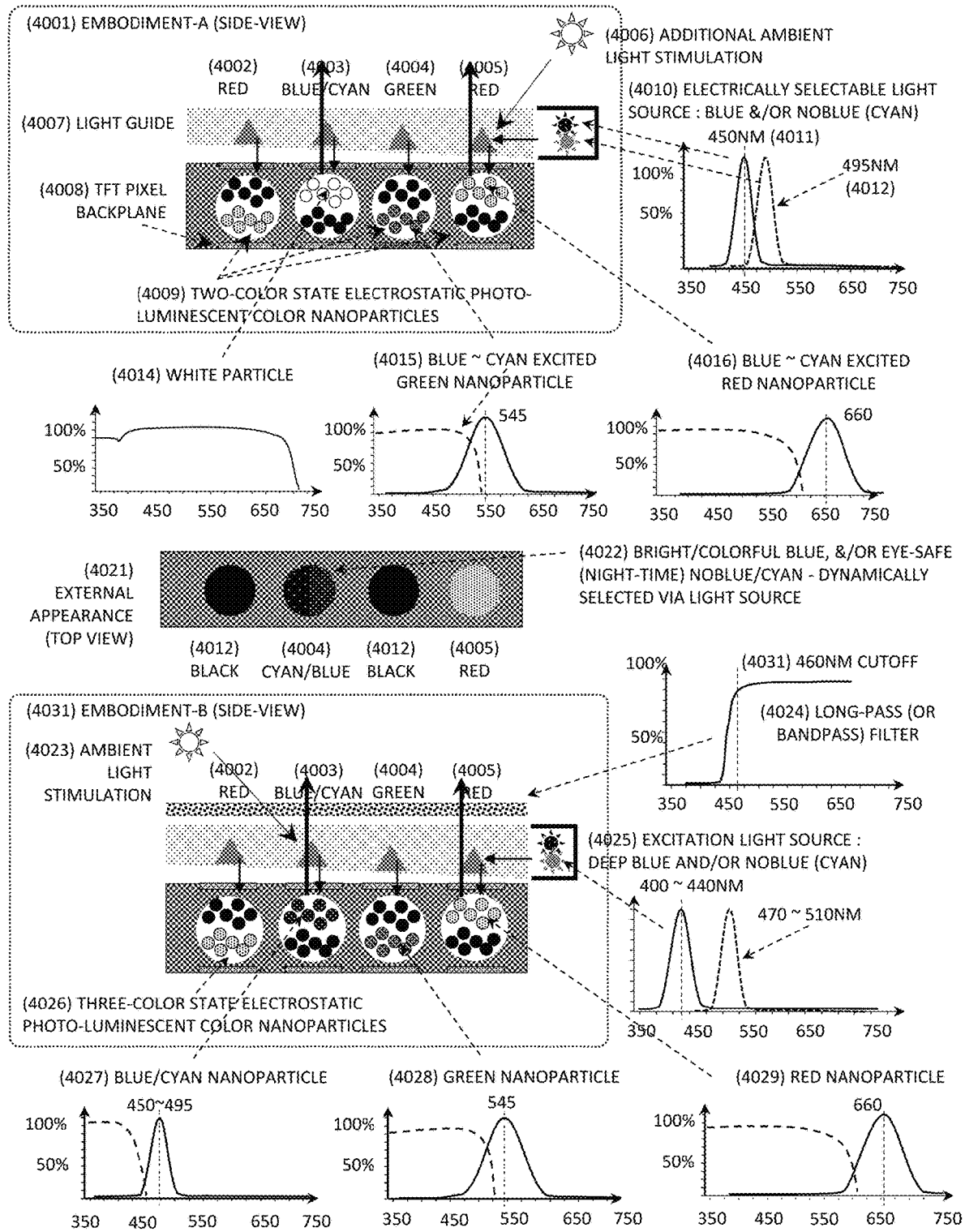
FIGURE 40 – EYE-SAFE FRONTLIT EMISSIVE COLOR (EPD) EPAPER DISPLAY

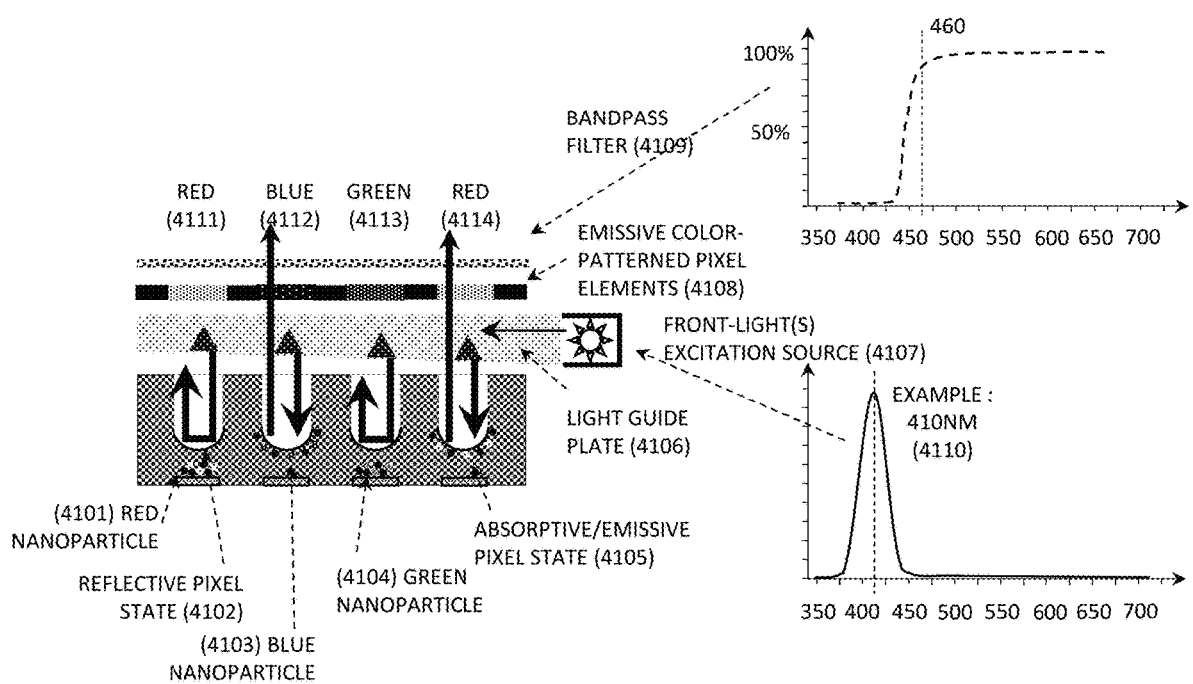
FIGURE 41 – EYE-SAFE EMISSIVE COLOR EPAPER DISPLAY BASED ON TIR MODE

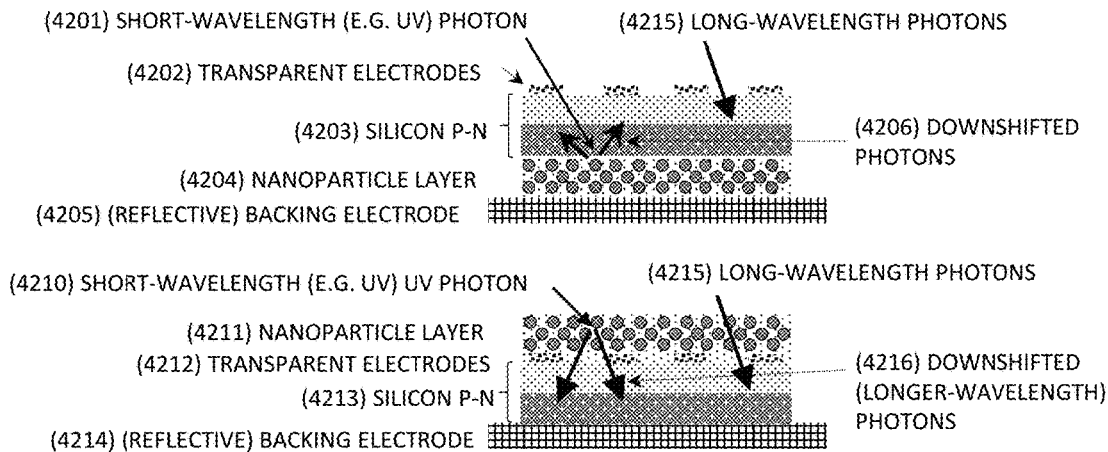
FIGURE 42 – SOLAR CELL WITH NANOPARTICLE CONVERSION LAYER
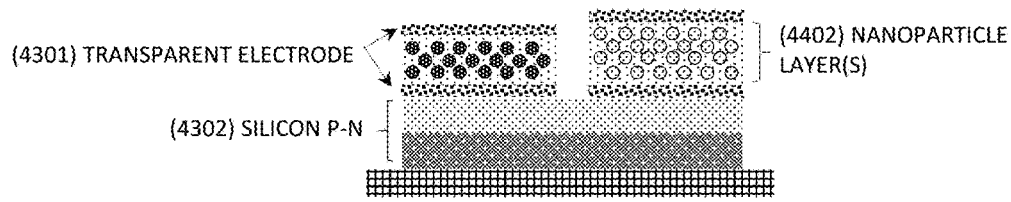
FIGURE 43 – SOLAR CELL WITH NANOPARTICLE FUNCTIONAL META-MATERIAL LAYER
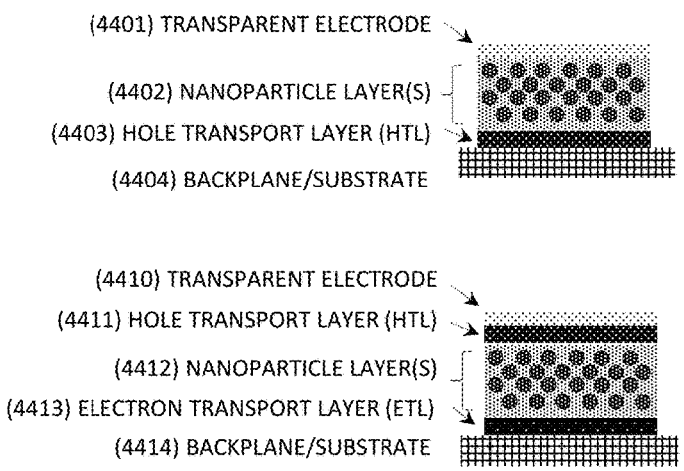
FIGURE 44 – SOLAR CELL USING NANOPARTICLE BAND-GAP

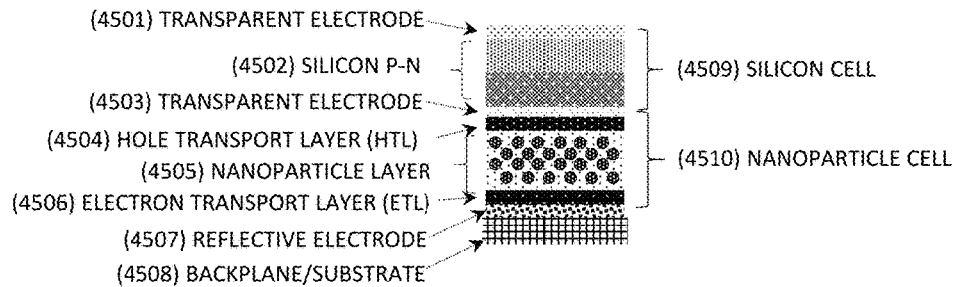
FIGURE 45 – TANDEM SOLAR CELL USING NANOPARTICLE LAYERS AND SILICON P-N LAYERS
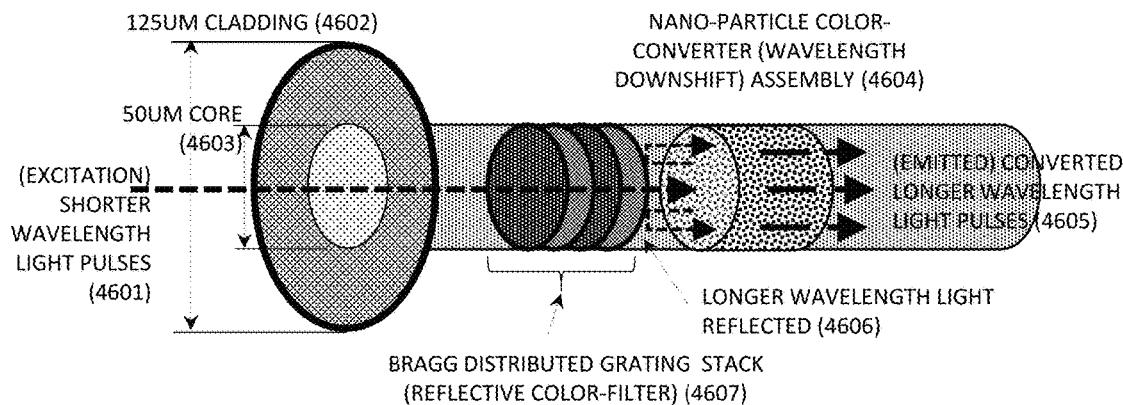
FIGURE 46 – FIBER OPTIC CABLE WITH COLOR-CONVERTING MATERIAL IN DISTRIBUTED BRAGG GRATING
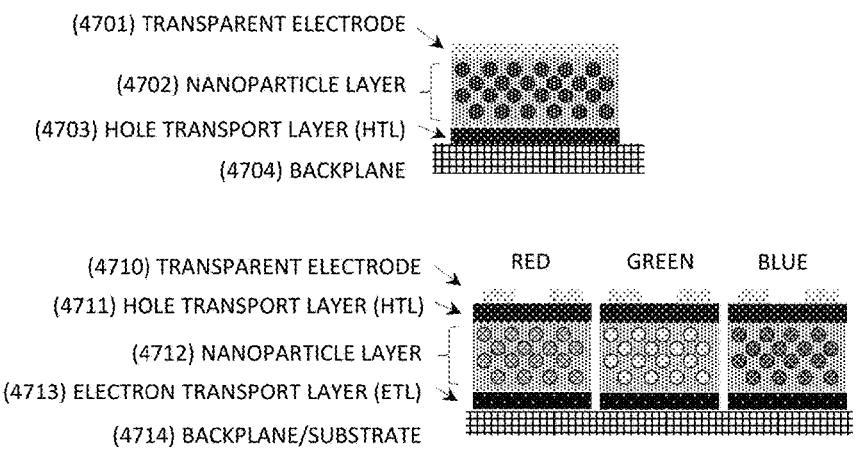
FIGURE 47 – IMAGE SENSOR PIXEL USING NANOPARTICLE BAND-GAP

APPARATUS AND METHOD FOR CREATING HIGHLY-FUNCTIONAL META-MATERIALS FROM LUMINESCING NANOPARTICLES

RELATED APPLICATIONS

This application claims priority of U.S. Provisional Patent No. 62/832,498, entitled "Apparatus and method for creating highly-functional meta-materials from luminescing nanoparticles," filed Apr. 11, 2019 to inventor David Wyatt, which is hereby incorporated herein in its entirety by reference. This application claims priority of U.S. Provisional Patent No. 62/832,792, entitled "Method and apparatus of a multi-modal illumination for improved color rendering, power efficiency, health and eye-safety", filed Apr. 11, 2019 to inventor David Wyatt which is hereby incorporated herein in its entirety by reference.

BACKGROUND

Nanoparticles

The term "Nanoparticle" generally refers to the class of materials in the sub-micron size range (≥0.000001 to <0.0001 mm). In these dimensions, the particles may exhibit properties beyond the normal material behaviors in the macro, or even micro (<1.0 to 0.001 mm), particle size ranges.

Of particular interest for this disclosure, particles in this size range (e.g. nanophosphors, chromophores, diffusers, quantum dots) can be at, or smaller-than the wavelength of light itself, and thus exhibit extraordinary interactions in the photonic, and plasmonic regimes in addition to the basic properties of the material.

MicroLED and Other Applications

Technically, the term "MicroLED" refers to an LED device with a dimension less than 1.0 mm, and greater than or equal to 1.0 um (micron). However, the term "MiniLED" has been applied to MicroLED's greater than 100 um in at least one dimensions. While MicroLED typically refers to devices with feature sizes in 1 to 24 um range. In this disclosure, any reference to MicroLED should be assumed as referring to either or both MiniLED and MicroLED. After growing MicroLED sized devices on wafer, two different applications types of MicroLED have emerged:
  A. Dicing into discrete, micron-sized, emitter chip-lets. For example, to distribute over a target backplane surface
  B. Arranged in a continuous array of sub-pixels, in a larger chip-sized display device. For example, to make a full-HD resolution display unit small enough to fit inside an head-mounted AR system In both MicroLED and MiniLED, the emitting area is considerably smaller than regular LED's, and yet they are still efficient, hence one of the key requirements is the high light-flux coming from a small area. Where light radiant flux density is typically expressed in Watts/$cm^2$, MicroLED have produced from 100 mW/$cm^2$ to over 10 W/$cm^2$ enabling illumination upwards of 1,000,000 nits (candela/$m^2$)—by comparison a typical phone display is 600 nits, a household light is 10,000 nits, and the midday sun is 100,000,000 nits.

Likewise, the junction temperatures of the MicroLED can operate in the range of 60 C to 150 C, but unlike OLED, MicroLED are resilient inorganic semiconductor junctions and do not necessarily need an oxygen barrier to achieve exceptional lifetime.

Early examples MicroLED created color from an array of different junctions, cut from different deposition-chemistry wafers, each with quantum band gap tuned to different light emission wavelengths. In the case of companies like Glo and Alledia, the colors are created using a single GaN wafer but with structures designed as tuned quantum wells, quantum rods, and quantum needles which radiate photons at a tuned wavelength. However, like all semiconductor devices, minor variations in the deposition layers, across the wafer, are very common particularly when such structures variations in the order of nanometers, leads to inconsistent performance. For digital IC's, this is manageable, but in the case of LED & MicroLED, this variation manifests as a visual difference in color, wavelength, and brightness non-uniformities.

One old (LED) solution to mitigate variations, reduce the number of variables, and susceptibility to Nano-scale variations, is to use a single-color wafer (e.g. In/GaN blue or UV), and color convert from blue to green and red using phosphors. However, the typical size of a single phosphor particle (5~30 um) is enormous by comparison to MicroLED devices (e.g. with feature sizes of 1 to 24 um), and the particle size varies greatly within the typical phosphor production making them impractical for use in addressing the MicroLED color conversion needs. This is a critical problem to be solved to ensure consistent brightness/color between micro-elements, since any deviation in distribution consistency lead to an effect called "mura" or the non-uniformity of white and dark levels, across different areas, which is especially noticeable in display applications.

What would be ideal is a nanoparticle sized color converter that could be applied directly onto the MicroLED with similar properties to the MicroLED device.

THE PRIOR ART

Prior Art MicroLED Color Converters

In the prior art, such as US patent/applications 9484504, 2014/0367633 and 2014/0339495 Bibl et-al[1] speaks to the application of "phosphors" on MicroLED. In the configurations exemplified, the micro emitters are widely spaced, and phosphor color conversion materials such as YAG:Ce are described, wherein these have an average particle size of 1~20 um. Bibl also describes applications leveraging Quantum Dots (QD's), and that these have a typical particle size of 1 to 20 nm.

[1] Bibl & McGroddy "Micro LED with wavelength conversion layer". U.S. Pat. No. 9,484,504

Bibl et-al defines QD's as being a highly-efficient kind of the phosphors with preferred Nano dimensions, and capable of color converting blue light emitted by the MicroLED junction.

Bibl et-al further describes the use of an oxygen barrier, to address QD sensitivity. But no method of preventing photo-oxidization, thermal quenching, heat-sensitivity, humidity-sensitivity, or other issues and limitations of QD's, well known to those versed in the art.

Prior Art in Quantum Dots

QD's are nanoparticles that operate at the quantum effect level, converting photons or electrons, into light at various wavelengths, according to their tuned size.

The high "quantum yield" (the Internal Quantum Efficiency (IQE)), or conversion efficiency of QD's actually falls off rapidly over time or with exposure to oxygen, humidity, or even intense light (photo-oxidization). Moreover, the External Quantum Efficiency (EQE), which summarizes the externally demonstrated performance, of QD's is greatly impacted by the encapsulation materials necessary to overcome the oxygen sensitivity.

While a raw CdSe particle can achieve over 95% IQE, once buried in a QDEF encapsulating barrier film (such as produced by 3M for TV applications) the net EQE drops to 70%, while embedding in glass (such as from QDVision) decreased EQE to 50%. These numbers are comparable to mid-to-high performance phosphors, but are considerably more expensive to make, even before including the exotic encapsulation.

Additionally, the high self-absorption of QD's (due to relatively small Stokes shift, and overlapping excitation and emission ranges), and tendency to conglomerate, means that the volume loading of QD particles must be constrained to below 30%. QD's cannot be densely stacked like phosphor particles, otherwise groups of particles will stick together (creating non-uniformities), and significantly absorb the photons emitted by neighbouring particles.

In summary: while the theoretical and raw particle efficiencies appear very high, in practical implementation, QD's have fallen far short of realizing the potential even after decades of intense activity.

At this time, developments in new QD technology, including Tetrapod and Cuboid nanoparticles, is opening the possibility of new applications with increased robustness. With the larger, more robust structure to protect the shell, they may yet become applicable in the kinds of applications defined herein.

Prior Art in Quantum Dots and Nanophosphors

Phosphors are comprised of inorganic materials, in general compared to than QD's they are: robust, operate at significantly higher temperatures, exhibit lower thermal quenching, are less insensitive to oxygen and humidity, and do not readily suffer from photo-oxidization. They exhibit a very large Stokes shift (the difference between excitation and emission wavebands), with low self-absorption of photons.

However, the particle sizes of the phosphors produced by the ordinary sintering and grinding processes, are typically in the 5 to 30 um range.

Bibl et-al describes a phosphor as having a dimension or between 1 um and 20 um, and notes a "phosphor nanoparticle" described as being between 100 nm to 1 um, but:
- phosphor do not occur in the size range 100 nm to 1 um, neither in nature; nor for example, when the raw materials are chemically mixed to create phosphors
- existing phosphor particles are created by a process of grinding that, at best, produces particles in the 5 to 30 um size range with a reasonable consistency in size
- no description is provided as how to accomplish making phosphor particles of 1 um to 100 nm size
- particles of size range 1~20 um are unsuitable for (the type B) contiguous MicroLED displays
- particles of size range 1~20 um are unsuitable for Color Filter, or other meta-material applications Given the compelling properties of MicroLED (high-resolution micron size, high brightness, long inorganic lifetime, natural insensitivity to oxygen and humidity)—all the properties that are lacking in comparable displays based on organic materials e.g. OLED's—the natural resilience of inorganic phosphors makes them highly desirable, if a solution can be found to make the particles smaller and retain their color conversion efficiency.

Making nanophosphors is a new process intended to apply the benefits of phosphor materials to smaller micron and nano-scale applications. Those familiar with the art will recognize that work has already been done in small-scale creation of nanophosphor particles, using laboratory techniques (such as co-precipitation). The general problems with these approaches have included:
- they produce very small amounts (micrograms) at great cost
- they are not been scalable (cost effectively) into volume production
- the size of the particles produced, varies considerably
- the particles produced have exhibited reduced efficiency due to a large ratio of surface defects While some work has been on-going with additional grinding of ordinary phosphors down into the smaller sized range (e.g. grinding down to a D50 in the 0.5~1.5 um range), those have not produced particles consistently below 1 um. Those that have been produced suffer from very poor efficiency for the above reasons.

Additionally, many of those phosphors used for making micron sized particles have been from the sulfide family, which are softer, and easier to grind. However, unlike most other phosphors, sulfides are more sensitive to humidity, and thermal quenching, especially when the surface area vs volume ratio is increased, as occurs when particle size is reduced.

In the prior art, Bibl et-al US 2014/0339495 cites phosphor particles between 100 nm and 1 um, however the varying efficiency and light output of nanophosphor particles in this wide range will vary greatly when an uneven distribution of particle sizes exists. This size range leads to visible non-uniformities in color and brightness, which is unacceptable for display applications. In short the assertion of a nanophosphor such as cited in Bibl et-al is not practical.

Bibl et-al also describes a spaced array of MicroLED emitters, wherein phosphors are applied on top of each, and phosphors in the range 1 um to 20 um in size, may be applicable. However, in the application of Type B. MicroLED displays with very high-density 1000 ppi and above, there may be only 1 um (or smaller) spacing between sub-pixels. In such contiguous fine-pitch display applications, nanoparticles much smaller than the range cited by Bibl, are necessary.

Bibl cites a device comprised of MicroLED excitation source plus color converter, where the excitation source is either blue (of 450~495 nm) or deep-blue (420~450 nm), or UV (not defined). Concerns with eye-safety in regards to MicroLED, particularly important for near-eye, heads-up and VR/AR display systems, have yet to be addressed.

THE INVENTION

Through laborious experimentation and testing, the methods of creating nanophosphor particles have been developed, from a combination of processes; starting with raw materials, applying processes to passivate the material surface, and create an activated material. The reduction in size has been achieved through combinations of new technology milling, and new sorting techniques, to achieve a consistent distribution of particle sizing. The methods were employed to create nanophosphors with a) majority size at 200 nm, and b) with an majority size at 70 nm, without significant efficiency loss between the two sizes, the disclosers have created a process can scale production of nanophosphors smaller than 100 nm in average size in large volumes.

The discloser then took the nanoparticles and combined into a meta-material apparatus, including optical films and nanopatterned structures. These structures leveraged the Nano-sized color-conversion particles, and enhanced the functionality of the implementation with optical, photonic and plasmonic structures, forming combined functionality previously unachievable (by the material alone, or by the structures alone).

The disclosure includes applications in LCD, OLED, and MicroLED displays. However, the capabilities of the robust particles were discovered to far exceed the original intended applications, and disclosures are also made of additional embodiments, that go far beyond the original inspiration.

Reference will now be made in detail to the various embodiments of the present disclosure, examples of which are illustrated in the accompanying drawings. While described in conjunction with these embodiments, it will be understood that these examples are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present claimed subject matter, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Similarly, the terms "pixels", "excitation", "emission", "luminesce", "phosphoresce", "fluoresce" in verb or noun form are not restrictive of specific implementations, but are in general a reference to mechanisms of light generation in lighting assemblies, fixtures, apparatus as used individually, and in display systems.

Reference will be made to photo-emissive elements, such as those excited by one or more wavelengths of light (whether visible or invisible) and operable to emit light at one or more other emission wavelengths. This includes those materials exhibiting the "Stokes shift" effect, wherein excitation by a photon of a given wavelength, is down-converted into different wavelength when the excitation energy is released in a photon emitted at a different wavelength. As well as those exhibiting an "anti-stokes" wavelength upshift. These classes of photo-emissive materials can include powder, liquids, gaseous and composite forms, and including particles, micro and nanoparticles. Examples may include phosphors, nanophosphors, Perovskite Salt (aka "Perovskite Metal Halide"), chromophores, fluorophores, Quantum Dots (QD), organic phosphors. Such materials may by their nature, fluoresce, luminesce or otherwise emit photons under photo-excitation. For the purposes of this disclosure the term "phosphor" and "nanophosphor" may be used interchangeably to refer to any of type of photo-emissive color conversion material, including any the above, operating on the photo-emissive or electro-emissive principal, regardless of whether fluorescing or luminescing, without limitation of scope, nor limiting the comparable embodiments inferable by anyone versed in the art, from the matter described herein. As used herein, the terms "color converting" and/or "color conversion" refer to the above-described process wherein a particle is stimulated by a photon of a first wavelength and, responsive to such stimulation, emits a photon of a second, different wavelength.

Similarly, the term "LED", "diode", "emitter" or "junction", may be used interchangeably to refer to embodiments based on Inorganic LED semiconductor junction diode, Organic LED (OLED), Quantum-Dot LED (QLED), Perovskite LED (P-LED), Quantum Well, Nanowires, Nanorods, Laser Diode, VCSEL, other electro-luminescent (EL) emitters, including the new Nanophosphor LED (NP-LED) disclosed herein, and should be interpreted as implying at least one or more of these embodiments, and not limiting the preferred embodiment to simply an inorganic light emitting GaN semiconductor diode.

Where applicable, alternate configurations of the above are also implied, as will be readily recognizable by anyone familiar in the art: for example, in the OLED industry[2] the fundamental device is a light emitting diode junction formed from organic semiconductor layers and phosphorescent emitters. While the materials in the Host and Emitter layers are commonly referred to as "phosphors" by the material suppliers within the OLED industry. And thus an "LED+Phosphor" may also infer an OLED with Host and Emitter layer, or a similar OLED with phosphor and TADF (Thermally Activated Delayed Fluorescence) materials, or a QLED junction with QD phosphor, etc.

[2]OLED Phosphorescence https://en.wikipedia.org/wiki/Phosphorescent organic light-emitting diode It is not the purpose of this disclosure to teach MicroLED design or construction of LED junction, nor the method of construction of the blue, deep-blue or cyan emitter from In/GaN epiwafer. Those familiar in the art of LED manufacturing and assembly will recognize that by tuning the GaN/InN alloy material, the bandgap and the emission wavelength, can be readily tuned from UV down to the red range. The invention is not restricted to alloys or GaN/InN, but also applies to LED's constructed from SiC Silicon Carbide aka Carborundum, or any semiconductor able to form a tuned band-gap with quantum wells wherein photons are emitted as a result of electrons crossing the valence/conduction energy band-gap.

An "LED assembly" may refer to the assembly of a single LED package, a MicroLED, or an assembly combining a plurality MicroLED die, or LED packages, or MiniLED wafer-scale chip packages, or other combinations. For example, in the edge-lit light bar of an LCD display, a LED light, a MicroLED array, or an OLED display, or multiple die within a package, or in separate side-by-side packages.

"Metamerism" refers to the scientifically observed difference in visual interpretation of colors. Due to different physiological and social characteristics[3] of viewers, any two people may view similar colors, slightly differently. For example, many western cultures refer to the ocean as "blue", while in Chinese it is often referred to as "green". It is impossible to provide a precise definition for color. There are ISO standards for colors, however these are still imprecise and there is overlap in the wavelengths. Some clarity is attempted through the definition of ranges used herein:

[3]Blue Green Distinction https://en.wikipedia.org/wiki/Blue-green distinction in language The term "blue" as a color may refer to light in the range of around 380 to around 495 nm, and is often associated with the shorter-wavelength high-energy portion of the visible spectrum from around 420 to around 470 nm.

The term "deep-blue" is often associated with the higher-end around 380 to around 440 nm, which overlaps the definition of UV-A of 315 to 400 nm ISO standard ISO-21348.

The term "light blue" often refers to the wavelengths around 470 to around 485 nm which overlaps with "cyan".

The term "cyan" is used herein to describe colors in the around 480 to around 520 nm range and overlaps with "light-blue".

The term "green" is used herein to describe colors from around 500 nm to 580 nm.

To avoid confusion: the term "blue" may be used herein to refer to the range of hues between UV-A, deep-blue and light-blue, but does not imply the "cyan" range. The cyan and green ranges may be inferred wherever reference is made to a "no-blue" configuration. The use of the term "blue" and "no-blue" however does not restrict or limit the implementation to any range referred to by any other definitions or standards.

Multi-Modal Light

In this disclosure reference may be made to embodiments selecting between blue and no-blue, where for example: blue implies a blue primary color in an RGB-based display, and the "no-blue" display may use cyan in an RGC color gamut, or RGCV where cyan and/or violet replace blue as a primary color.

For the purposes of this disclosure, the "no-blue" infers just one embodiment of the invention wherein the apparatus is capable of choosing between two modes of lighting, and/or between any two modes of color rendering, wherein a second mode has either:

a) a different color emission profile than first mode
b) a different color space of operation than first mode
c) a different rendering color gamut than first mode
d) contains one or more different primary colors than the first mode Other combinations besides blue and cyan are anticipated by this disclosure, however for the purpose of simplicity wherever cited, the terms: blue and no-blue, or a transition between blue and no-blue, should be assumed to also imply similar analogous embodiments with other colors and modes such.

Additionally, other combinations with more than two modes are anticipated, for example the aforementioned multi-modal light source can switch excitation sources to: blue, cyan or blue+cyan. Other embodiments such as a deep-blue, blue, cyan are described for creating virtual blue. And a blue, cyan, green or yellow are anticipated.

The methods described for controlling multi-modal light sources and the color space to conversion apparatus are intended to be applicable to those required to switch between: cyan and yellow in an RGC and RYG (effectively a no-blue and no-cyan color gamut); or between RGB and RYGCBW; or between RG1B1 and RG2B2, where G1B1 and G2B2 are slightly different center wavelengths of green and blue respectively; or between backlight sources tuned to provide optimal DCI-P3 color rendering, and one for AdobeRGB i.e. where the center wavelengths of the blue & green primaries are tuned for each color space so as to provide a selectable backlight emission profile modes.

Nanophosphor Production and Sorting Process

Traditionally, the process to create phosphors involves wet-mixing of chemicals, including an appropriate amount of dopant (an activator metal), causing the replacement of elements with the alternate activator material (e.g. heavy metal such as Manganese, or rare-earth metal from Lanthanide family, such as Europium), according to the desired emission color, and response. The material mix is dried into cakes, and then sintered at high temperatures, to cause crystallization and activation at the doped centers of imperfections. The crystals are then reduced in size using a grinding-mill as illustrated in FIG. 2. Typically, particle sorting (e.g. via sieves) produces a size-range, consistent with FIG. 3. The process produces particles that are typically in the range of 5 to 30 um depending on the material and the amount of grinding time, for example a popular green oxynitride (e.g. $SiAlON:Eu^{2+}$) has a D50 of 20 um, while a red oxynitride (e.g. $SrSiON:Eu^{2+}$) has a D50 of 10 um.

The method of creation of nanophosphor particles leverages a combination of processes, starting with larger phosphor particles and reducing in size through an advanced ball milling process. The size-reduced materials are re-activated, and coated, to achieve a consistent size range of particles with acceptable performance. The methods were employed to create nanophosphor with an average size less than 300 nm, less than 200 nm, and smaller 100 nm as exemplified in the particle analysis below performed by an independent laboratory.

Multi-Stage Ball-Milling Processes

Milling is accomplished in a high-density hardened Ball Mill, using a suspending fluid. This is quite different from any of the previous crystal grinding processes used to produce phosphor particles, these are typically dry processes that relying on passing the material cakes through grinding wheels. In the new process the material is kept in a slurry form, of suspending fluid and particle, while hardened milling balls collide with the particles at very high-speeds compressing the particles against the sides of the hardened milling bowl and other milling balls.

Note: the milling machine is not the area of novelty claimed herein, and anyone reasonable skilled in the art of ball milling, will understand this process[4], FIG. 5 is illustrative of the basic method.

[4]Ying et-al, "One-dimensional nanomaterials synthesized using high-energy ball milling and annealing process"

The suspending fluid is chosen from a group of fluid/solvents that does not react with the phosphor materials, and do not react with the milling bowl and balls. The ideal group of solvents primarily includes: pure water, xylene, benzene, alcohol and iso-propyl alcohol (IPA). Solvents are chosen based on those that are easiest to suspend the material, and remove without residual contamination. Water is simplest, but in some cases but can interact (e.g. with materials in the sulfide family), while benzene, xylene, hexane are viable, but are more toxic and more difficult to handle.

The inventors found the best solvent for compatibility with subsequent processing stages, for example, in the patterning process are Xylene or IPA, which are typically more compatible with the intended UV curable photo-resists such as SU-8[5], and in an ideal embodiment prefer IPA as it is generally less dangerous than Xylene.

[5]http://microchem.com/Prod-SU8.htm

The grinding bowl is made from a group of hard materials that will not degrade under the action of hard milling balls: Zirconium ($ZrO_2$) bowl with Zirconium milling balls being an ideal combination. The bowl and actuating milling mechanisms, are sealed with a suitable gasket resistant to leakage, or interaction with the solvents, including silicone, or viton. The milling machine rotates the slurry of particle, solvent and milling balls at variable velocity within the grinding bowl. The speed, ball size, and length of grinding are chosen based on material, solvent and desired target particle size.

The milling is optimally performed as a multi-stage milling process: in a first stage, larger 2~3 mm $ZrO_2$ balls are used for 75 min with roughly double the volume of IPA vs material. Reducing from a D90<70 um (D50: 20 um) to a D90<1 um. Followed by 45 mins with 1 mm $ZrO_2$ balls 100 nm. During the process additional IPA may be added as it evaporates or to keep the slurry viscose and moving evenly. In between steps, the material is passed through a sieve of appropriate hole size (e.g. with 1 um size holes for D90<1 um processing step) to catch "outlier" (large unprocessed) particles, and remove the milling balls, which are then cleaned (for example using the same solvent as suspended the particles) and re-used for processing new material as well as outlier particles.

In another implementation of the process, the material processing is moved from large batch processing, down to finer grain in a more powerful faster miller, with smaller milling balls 1.0 to 0.1 mm in size, to take the particles from 1 um to D50 of 200 nm, 100 nm, or 50 nm. At each step using the sieve to separate balls from slurry, and washing the balls with IPA to removing attached particles.

Sphericalizing

In typical phosphor grinding process the particles form cavities in the surface of the crystals which create volumes that can trap photons. The cavities interfere with efficient absorption, and can cause self-re-absorption of photons where the converted photons fail to be emitted. Smoothing the surface by annealing can remove cavities which increases conversion efficiency, and optical efficiency of the emission process.

One method to reduce cavities is through rounding using large rollers in a bowl that forces the particles to roll as they are ground, this is called a "sphericalizer" in that it tends to create spherical particles. In one embodiment the sphericalizer is applied to the slurry to either enhance the milling process and/or improve the surface uniformity, and decrease cavities, for example of material that has already been milled.

Removing Contamination from Ball-Milling and Sphericalizer

In the case that hardened steel is used (milling balls or sphericalizers), additional application of a magnet field is used to assist in the remove of residual iron contamination (from milling balls). Alternatively adding chemicals to remove other contaminants (e.g. Fe, $ZiO_2$, Ti) from milling process (e.g. using zirconium oxide, or titanium carbide milling balls) but leaving the phosphor unaffected is possible in some embodiments where such chemicals (e.g. HCL for removing Fe from Silicate phosphor) are chosen from a group that are unreactive with the phosphor matrix.

Preparation of Nanoparticle Via Sol-Gel Method can Use Non-Aqueous or Non-Hydrolytic The sol-gel process is a wet-chemical technique used for the fabrication of nanoparticle materials. In this process, the sol (or solution) evolves gradually towards the formation of a gel-like network containing both a liquid phase and a solid phase of materials. Typical precursors are metal alkoxides and metal chlorides, which undergo hydrolysis and polycondensation reactions to form a colloid. The basic structure or morphology of the solid phase can range anywhere from discrete colloidal (solid-liquid and/or liquid-liquid) mixtures, all of which contain distinct solid and/or liquid particles which are dispersed to various degrees in a liquid medium. The product can be dried or retained in an aero-gel, in an ideal embodiment the particles are transferred into the solvent preferred for the next stage of processing e.g. with IPA or Xylene for UV photo-resist patterning. The sol-gel process is a well understood tool of chemists, and a frequently used method of creating particles, and is not considered necessary for incorporation in this disclosure at this time.

Re-Crystallization and Secondary Activator Doping

At the heart of phosphor crystal molecular structure, the doped activator in the imperfection permits the band-gap energy exciton to exit the structure, as a photon.

The inventors discovered that, after milling, material breakdown can result in a non-uniform crystalline activation profile. Particle sub-crystals (with activating dopant metal) may divide such that one portion has none or an insufficient amount of the activating dopant, and thus no longer exhibits the characteristics necessary for phosphorescence, leading to an inconsistent or decreased amount of activated phosphor crystals. To mitigate these problems, an additional processing step may optionally be performed.

It is also been discovered that during the milling process, it is possible that the material used in the milling can cause deactivation, for example nickel is well known to deactivate the phosphorescent effect, meaning that the above described process of milling-contaminant removal may need to be performed before the methods described herein are applied.

In one method, the material is re-crystalized in a sintering process (heat), and addition of activator metal dopant is introduced. The sintering process may be performed before or after re-addition of dopant. This process is similar to that initially performed to create the phosphor materials, and serves to re-activate particle materials.

Doping can be performed by introducing the metal in a compound during sintering, however in another method, the particles may be spin-coated into a thin film layer (for example using a low-viscosity suspending fluid), and then introduced into a sputtering chamber where the activator metal is sputtered over surface, causing the activator metal to re-attach to the crystal. In another method, the material is bombarded with metal ions for example, ejected from an electrode under high-energy excitation. In either embodiment, the activator metals are chosen from the set of the lanthanide family, such as rare-earth metals Europium (Eu), Cesium (Ce). However, other heavy metals e.g. Manganese (Mn), are anticipated as suitable activator candidates. And other methods are anticipated including immersion in chemical bath and drying, and performing the sol-gel method to coat the materials.

After re-activation the material may be dried and ground again, and the process repeated until the desired efficiency is achieved.

Particle Passivation to Improve Performance and Resilience

The photon absorption, conversion and emission process, occurs within a thin envelope at the surface of the phosphor material. As particles decreases in size, the ratio of surface area to volume increases, and one of the challenges in creating nanophosphors is the increase in ratio of surface defects created versus the actual conversion area. Surface defects tend to trap photons reducing the conversion efficiency.

One known solution to this is to coat the particles, which alters the surface refraction, reduces light absorption in surface defects, passivates the particle surface, and also helps improve the properties of the materials such as: thermal resistance, immunity to oxygen and humidity, protection from solvents, and enhanced mixing with binders/encapsulants.

In a preferred embodiment, the particles are coated with Silicate ($SiO_2$) to provide this improvement. However other materials are well known to provide a similar protection, for example including Aluminum Oxide, Nickel Oxide, and ITO (Indium Tin Oxide) which provides the benefit of being transparent and conductive. The sol-gel method can be used to control the coating application, as can fluidization bed, however the Stöber method is preferred for its simplicity. Describing these specific chemical processes in this disclosure is unnecessary, is familiar with those experience in the art, and the methods of coating application to nanoparticles is well documented[6]. What is novel is the application to nanophosphor to improve light-emission efficiency, and robust survival in the lighting, display and functional metamaterial applications described herein.

[6]Kobayashi et-al, "Silica coating of silver nanoparticles using a modified Stöber method"

In another embodiment, a fluidizing tank is arranged to contain the particles in an unreactive solution while gas containing the coating molecule is bubbled through the tank via a sieve at the base. The particles are kept moving through the tank via a number of means such as stirring and fluid jets. When the gas interacts with the particle it forms a coating which serves to insulate the particle.

Particle Size Separation

Milling is a statistical process. On the very first impact of ball and material, a fraction of the original material particles is reduced into micron and sub-micron sizes. The longer the milling process is applied, at any given stage of ball-size, the probability of impact increases, and thus the ratio of particles falling within a mean size range. Applying smaller milling balls moves the mean to a lower range, but running longer at the larger milling ball-size, before transitioning to smaller balls, reduces the occurrence of outliers i.e. the small percentage of material which has received fewest ball-impacts, and remain considerably larger than the majority particles. These outliers can ruin the target application e.g. in patterning a color filter of a large area TV display. To reduce the occurrence of outliers, the preferred process is to run the milling for the duration determined necessary by statistical analysis for a given type of material hardness, and type of balls and bowl. As well as applying size sorting (e.g. sieve) to catch and re-process or reject outlier particles. This is not a fixed amount or ratio, but is a repetitive process of trial and error for each type of material, followed by particle size distribution analysis and re-tuning.

In one embodiment of the process described herein, the particles are processed until the D90 distribution is an order of magnitude smaller than the target patterning feature size. For example, by milling until D90 is below 100 nm (sub-micron), separation and sorting may no longer be necessary in order to fit into example target MiniLED 100 um (micron) application, or MicroLED with feature size of 3×8 um sub-pixel, or 1 um opaque border—regardless of the distribution of particles within the range. By ensuring that the particle size is a magnitude smaller than the feature size, this approach has the advantage that an even distribution of particles and particle-performance is achieved when applied to the target features.

However, the time taken to ensure an even processing is usually only achievable by running longer and/or performing more steps (e.g. more than one milling ball-size)—all of which is increases the processing expense. Early sorting of the particle, into smaller size batches, reduces the processing time and amount. And after removing suitable sized particles, new material can be added to create a faster continuous process. To fulfill this need, an efficient means of sorting sub-micron particles at high-speed and volume is necessary.

In the simplest embodiment, this is accomplished using micron and sub-micron sieve/filters as described above to catch particles larger than the mean, and reject for reprocessing.

In another embodiment, an apparatus for differential size-sorting, micron and sub-micron sieves is arranged in front of series of channels. The sieves separate particles by size, allowing the particles of the respective size (or smaller), to flow into the respective channels. The sieves are, for example, thin metal such as aluminum. Typical methods for drilling holes are assumed, for example using laser drilling for micron sized holes, and nanolithography for etching sub-micron holes.

The particles suspended in solvent are passed in a channel, with fluid pressure and/or gravity applied to move the particles forward, and one or more exit channels for each of the sorted particle sizes. In another embodiment fluid pressure may be applied in the reverse direct (upwards and against gravity), as depends on the configuration/orientation of the channel and the size of the particle (i.e. whether fluid, gravity or interactions need to be counteracted or enhanced). With gravity assisted separation, the apparatus and channels may be arranged vertically or horizontally as in FIG. 6.

In front of each exit channel are arrangements of analysis sieves, of the micron and sub-micron size, arranged to permit passage of particles smaller than the sieve hole size. In an ideal embodiment the fluid is the same as the suspension solvent used to process the material e.g. IPA for ball milling.

In an embodiment, one or more sieve frames, are attached to an ultrasonic transducer. The ultrasonic vibration is applied to the sieve frame, which is housed in a flexible/compressible gasket (e.g. silicone). The vibration serves to accelerate the separation process, by keeping the particles in front of the sieve in motion, and preventing particles from clogging the sieves and blocking smaller particles, by congregating around the analysis holes (note this method is also applicable to sedimentary, and centrifugal sorting methods). The sieve frame is suspended in a flexible compressible gasket (e.g. silicone) chosen to permit vibration of the sieve similar to the diaphragm of a loud-speaker, while keeping a tight seal around the sieve and the channel walls. In one embodiment, an ultrasonic reflector element is placed ahead of the transducer, creating standing waves within the fluid which tend to collect hold particles, against the force of the fluid pressure (&/or gravity), away from the sieve.

In an embodiment, the ultrasonic frequency and amplitude is tuned to apply desired backward pressure, according to particle size. In one example, the system may be tuned such that larger particles are targeted and repelled more strongly (for example by lower-frequency ultrasonic), to counteract the fluid forward pressure. The two forces may be balanced, for example to slow forward progress of larger particles, or stall them in front of the analysis sieve. After sufficient processing time has elapsed to collect the smaller particles, the fluid in the channel which may include larger unprocessed particles, may be drained, and the salvaged particles may be reprocessed, or reduced using the above described methods e.g. repeat ball milling.

In one embodiment for sorting sub-micron sized particles, microwaves are used to attain standing waves of smaller wavelength. The microwave frequency is chosen based on the size of the wavelength which determines the size of the standing wave. The standing wave may be tuned to match the target particle size intended to be captured/stalled by the interference effect. In such embodiments, a microwave reflector plate (for example, a solid metal plate, or a metal plate with large enough holes to permit passage of all particles but not the incident waves, or of a size small enough to permit particles to flow around it) is arranged in front of a sieve-diaphragm and a microwave emitter. The frequency (of the emitter) and distance (between emitter and reflector) are tuned to create standing waves from the interference between the forward and reflected waves. Particles smaller than the size of the interference front, are trapped and caught in the constructive wave front.

However, other embodiments are anticipated for creating and using the interference effect, for example by multiple transducers operating with controlled phase relationship. Create large standing waves in some regions, and smaller standing waves to traps smaller particles in other regions. Or to do the inverse such as small enough to trap only smaller particles, while permitting the flow of larger particles. Other forms of transducers and frequencies are anticipated ranging from RF to Microwave to Terahertz to InfraRed and Visible Light wavelengths.

At each stage, the materials may be passed through multiple size sorting process, either with the same channel and same sieve sizes, or with smaller sieves. The process may also be replication in multiple downstream stages, for example where each stage separates the particles into smaller and smaller groups of two or more categories e.g. A: >2 um vs ≤2 um (sieve with 2 um holes) vs ≤1 um (sieve with 1 um holes), followed by B: >500 nm vs ≤500 nm vs ≤250 nm, followed by C: >200 nm vs ≤200 nm vs ≤200 nm, and so on. The first group representing particles that are left in the channel and did not pass through the sorting sieve. In another embodiment, the particles from each larger sieve (e.g. A, C, E) are reprocessed by intermediate size analysis, to catch smaller particles that passed through larger hole at the previous stage e.g. particles that pass through 2 um hole are passed through another sieve analysis A1<1.5 um vs <0.75 um, and particles that do not pass through either, or passed through another channel with the ultrasonic back-pressure altered to catch different sized particles. Rejected particles can be returned for re-processing e.g. in the ball milling.

In another embodiment, the process is reversed, the sieves are not used for sorting by size, instead the standing waves are tuned to catch and suspend smaller particles, while allowing large particle to pass through the channel and be collected for re-processing.

Other methods of sub-micron particle size sorting via particle entrapment are also anticipated, including:
the use of beam refractance, as per the "optical tweezer" effect
centrifugal sorting
vortex sorting Sorting particles in a dry-air vortex is a technique commonly used for sorting ash particles (for example as emitted by coal burning power-stations, and are used to categorize particles for preparation in other applications e.g. cement). The process is very amenable in separating the nanophosphor suspension, in evaporating the solvent and separating the particles, based on air pressure.

Embodiments using centrifugal separation are anticipated wherein the larger particles tend to be heavier and attain a higher velocity, allowing them to be separated by exit-channels, arranged at points along a column, according to the particle size.

Sedimentary analysis while the nanoparticle is mixed with solvent is also anticipated, although known to be slower, it can be readily scaled into large material volume applications.

Nanoparticle Meta-Material Apparatus
Functional Nanomaterial

Functional meta-materials are those which offer features, and demonstrate characteristics, beyond the basic properties of the material used in the construction.

In this disclosure, nanoparticle color converters are described in structural arrangements exemplifying functional meta-material designs, which by their nature exhibit exceptional properties, going beyond the basic color-conversion functionality.

Sone of the structures described in this disclosure include: color-converter, waveguides, photonic lattices, 1D and 2D grid array polarizers, phase array color filters, lenses, color filters, and other functional metamaterial designs, and combinations thereof e.g. color-converting wire-grid polarizer. However, it should be clear that many other structures are possible, and the applications are not restricted to this list. Such as the Color Filter Made from Bragg Phase Array in FIGS. 7 and 8.

Bragg Reflector

In the simplest arrangement a Bragg reflector is formed from an alternating sequence of different refractive index (RI) materials, which functions to reflect light of a specific waveband: the "Bragg wavelength". The number of alternate pairs increases the mirror efficiency, and the optical density (OD) blocking function. Alternatively increasing the contrast between the refractive indices of the layers, increases both the OD/reflectivity, and the rejection/reflection waveband range size.

In this disclosure, a Bragg grating is formed from nanoparticle conversion material and other materials, of different refractive indices, such as transparent, opaque or alternate color conversion material. The structure may be 1-dimensional (e.g. layers of materials), 2-dimensional (e.g. X-Y array of differential refractive index), or 3-dimensional (e.g. a "log-pile"). On each axis there is a regular spacing "Λ", which can be independent per layer, or per axis, or per-material creating complex reflection/transmission functions. References below are as per the elements of FIG. 8.

In one simple embodiment, the layers are arranged to form a dielectric mirror tuned to reflect the wavelength of blue light and to only pass converted light. Where the "Bragg wavelength" is defined by:

$$\lambda = 2n_c \Lambda$$

Where: λ=reflected wavelength, $n_c$=refractive index, Λ=grating spacing

In one embodiment, as per FIG. 9, a layer stack is fabricated so as to convert blue light of 450 nm into other colors (e.g. red, green, cyan as in the Figure below), substantially avoid blue from exiting the structure, and efficiently recycle blue within the (thinner) material layers, until converted. For a Bragg reflector tuned to 450 nm, from material with a refractive index of 1.8 (roughly the RI for green), the spacing distance will be in the order of 120 nm to 150 nm, with a variation in grating distance introduced in order to widen the rejection band. It will be obvious to anyone versed in the art, that this Apparatus is only possible with nanoparticle color converting material with a majority particle diameter D90 substantially smaller than 120 nm, which includes QD, PS and the Nanophosphors (with a D90 less than 100 nm), as described in this disclosure.

In another embodiment the material stack is one constructed along the model of a Distributed Bragg Reflector wherein a) the refractive index between material layers is varied while b) the layer thickness is varied within a range of around ¼ the reflected wavelength. The result is predicted by the equation below, where R is the reflectivity, while $n_o$ is the RI of the originating medium (e.g. air), while $n_B$ is the RI of the substrate supporting the layer stack. And the band-range $\Delta f_0$ of the reflection is centered on $f_0$, the Bragg wavelength.

$$R = \left[ \frac{n_o(n_2)^{2N} - n_8(n_1)^{2N}}{n_o(n_2)^{2N} - n_8(n_1)^{2N}} \right]^2 \quad \frac{\Delta f_0}{f_0} = \frac{4}{\pi} \arcsin \frac{(n_2 - n_1)}{n_2 + n_1}$$

A number of embodiments using the recycling layered filter are anticipated, including application over the LED. And over in place of the absorptive color filter.

In one embodiment the method of creating the structure a spincoat

In one embodiment the layers where the originating light enters the structure is itself covered with a multi-layer bandpass which permits blue light to pass-in, but reflects (blocks) lower-wavelength light.

Functional Nanomaterial Devices

In one exemplary embodiment, a functional reflective polarizing layer (using brag-filter, dichroic, LC or similar) is configured within the implementation (for example, directly over the LED package, or over an emissive film) and is operable to pre-polarize the emitted light, and reflect (unpolarized or wrong-polarized). Behind such a structure a reflective backing surface (flat or parabolic), and/or a diffuse element (such as TiO2 or similar light-diffusing material in binder) to scatter and twist polarization of back reflected light for recycling.

Combined Nanoparticle Layers

In one embodiment, each specific type of emission-color nanoparticle is suspended in a matrix material, wherein each layer is a separate layers comprising a specific nanoparticle color material, or materials, and wherein each layer is a film less than 25 um thick, and wherein the layers then combining to form an overall multiple-layer film.

Candidate binder materials include matrix materials such as glass, ceramics, plastics including Polycarbonate, Polyethylene terephthalate PET, silicone and other polymers which can support holding guest particles in suspension.

The suspension can be in a liquid phase such as in Silicone, or Silane—and converted into solid phase through UV-curing, heat-curing, or activating agent, as necessary to form a solid layer encapsulating the particles.

A spin-coater is a machine in which a viscous solution is introduced into the center of a platter, and which the platter spins outwards with centrifugal force, so as to evenly spread the material over the platter surface, through the use of centrifugal force.

In one embodiment, a high-viscosity binder and nanoparticle suspension is applied into a spin-coater, which serves to evenly disperse the solution of the nanophosphor suspension into a film-layer of uniform particle density and thickness. In one embodiment the suspension consists of one types of color conversion nanoparticles only, however in other embodiments multiple types may be combined.

In another embodiment a spray-coater is used to evenly disperse the targeted nanophosphors onto film-layer substrate, with a film of uniform particle density.

In one embodiment, the particle and solvent each layer formed from a single type of color conversion particle, applied by at least one the above methods. With a transparent adhesion interface on the surface of each layer.

In one embodiment dispersion particles such as TiO2 are included so as to evenly disperse light through the layer, effect a higher efficiency conversion, or diffuse the light.

Functional Thin-Film Stack Formed from Layers of a Uniform Thickness Monolayer of Nanoparticles Remote phosphor films are well known to be an efficient color conversion solution in lighting. As a remote converter, they are further from the highest density light flux at the source, and can be thinner and more efficiently convert light with less conversion material, and without the typical issues found for solutions directly in the package (e.g. shorter lifetime, thermal quenching reduction in output efficiency due to QD/phosphor heating).

One of the challenges in the prior-art of producing thin-film remote phosphor layers is producing consistent and uniform color converter particle distribution in a film, when the target is thinner (e.g. under 25 um), but the typical phosphor particle has an large range of sizes (e.g. 5 to 30 um). Hence in the prior art U.S. Pat. No. 9,644,817 Hisham Menkara, there has existed a practical limitation preventing implementation of films of around 25 um or thinner.

Prior art approaches such as additional grinding of phosphors (e.g. to a D50 1~5 um) does not substantially solve these problems. It still remains impractical to 1) ensure a consistent color/brightness uniformity when the particle size is a large fraction of the film thickness, 2) deal with outlier particles (e.g. the 10% remainder of the %90 that are ground to with a D90 of 1 um) which are within the size range such as will destroy a film, or reduce the yield to areas that are smaller than useful e.g. to uniformly cover the screen-sized surface of a 2D MiniLED backlight for an LCD device display.

In the case of MiniLED backlight described below as per FIG. 10, an embodiment for replacing the existing side/edge-lit backlight module with a 2D Mini-LED stack is illustrated. To do so the entire 2D MiniLED stack must fit within thickness less than 300 um. This includes the Backplane (e.g. polyimide flexible thin PCB ~100 um) and the MiniLED (e.g. around 90 um tall), leaving just 100 um for the color conversion layer and diffuser.

An additional problem with prior art approaches to mixing conversion particles (QD, Phosphor, and others) is that of cross-absorption, wherein one particle absorbs the light already converted by another particle, and thus double spend the conversion loss (which translates to energy loss and lost battery-life), as well as an imbalance in color gamut and white point. In QDEF layer films this is a particularly difficult problem of InP green which has overlapping excitation and emission curves (see elsewhere in this disclosure). In phosphors of all kinds, lower energy photons are not absorbed and convert to higher energy wavelengths (except Anti-stokes particles as described in Wyatt US2017/0269279). Thus, in all prior art combinations of phosphors, mixed to achieve a desired spectrum, it has always been very difficult to make the desired balance of green, red and cyan, when green & cyan are also within the excitation range of the red particles, and cyan is in the range of absorption by both green and red particles. In other situations certain phosphors are more absorptive than others required to provide a desired spectrum, and are ideally placed further from the source.

What would be ideal is a solution where particles of each conversion wavelength band can be kept separate, and yet combined for example staged in sequential order, so as to prevent cross-absorption while still mixing to achieve the desired combined spectral output.

As a result of the capability to produce regular size distributions of nanoparticles in this disclosure, a new class of thinner remote phosphors and color conversion films is enabled. And also affords the opportunity to include metamaterial functionality in such a film apparatus, for example: to replace existing functional layers in display stack (diffusion, polarization . . . etc), or add additional capabilities (focusing, array segregation), or augment the efficiency (recycling color filter). Various methods to construct said color conversion devices are presented here, along with the methods and process to produce the described apparatus.

As with other embodiments, an adhesive interface can be introduced on each layer to promote construction of the film stack. This can be accomplished through ionization of the surface. In other embodiments, a transparent adhesion material is applied on to the surface which interacts with the surface of the host material (such as silicone, siloxane and silane) to promote adhesion. Pressure may be applied to compress the layers into the film stack while additional heat applied, to cure the layers, thus imbuing additional robustness to the film stack. Those familiar with the art of thin-film construction will be familiar with the various techniques and they are not claimed as novel herein.

Spin Coating

Spin-coating[7] is a method of creating films of uniform thickness in micron and sub-micron range, using a device which applies centrifugal force generated by rotation of the base plate, at extremely high rotational speeds (e.g. 2000~5000 rpm), counteracting the viscosity of a fluid mixture applied at the center of the spinning plate. Spin-coating is commonly used for applying micron and sub-micron thickness films onto silicon wafers for semiconductor processing, for example coating of a combined mixture of UV-photoresist and doped material, prior to photo-lithography. They are equally applicable for layering films on any host substrate, including PET, Silicone, Sapphire etc.

[7]https://en.wikipedia.org/wiki/Spin_coating

In one embodiment, a monolayer film of each type of nanoparticle, is created from a mixture of nanoparticle and low-viscosity polymer matrix, spread on a spin-coater. The material may be deposited on top of the host substrate, or onto a temporary lift-off host surface. Such methods can produce films where the total thickness is, for example, less than 25 um and sufficiently thin to enable a multiple layer stacking, and to introduce functional layers with additional features, forming a thin film-stack with the desired spectral and light-shaping output.

In one embodiment, the layers are constructed by spin-coating the nanoparticle mixed together with a suitable resin (for example SU-8). The resulting monolayer is cured, for example with heat, and exposure to UV light in the 350 to 400 nm waveband, to solidify the matrix with the suspended nanoparticles.

Given each color conversion material has its own characteristic efficiency of conversion, such an embodiment may incorporate multiple layers of each material in sequence, for example: red, red, green, red, red, green, . . . etc, in an example where a red layer was half as efficient as green layer. Or where the output of the red primary was intended to be twice the strength of the green. Given each layer has a limited transmissivity, the amount of blue vs converted color is also adjusted by increasing, or decreasing, the number of monolayers.

Though the individual layers, as per FIG. 11, may have relatively thin with high transmission, the individual layers can have very high volume loading of particles for efficient color conversion, and a repetition of layers to affect the desired balance of excitation vs emission.

Nanolithography Pattern Transfer

Various methods exist to create a micron to sub-micron pattern on thin film, whether or not the film was created from spin-coating.

In a UV photo-lithography method, a pattern layer forming a mask of the required features, is applied on to the film coating of UV-resist (e.g. an opaque SU-8 UV-resist material combined with nanoparticle and spincoated onto a substrate), which is then exposed under UV, heated and developed to retain the desired pattern, etched in the combined SU-8 resist.

This may be repeated in multiple steps to build a layer structure, for example by applying a different nanophosphor on each layer level through spin-coating, exposing and pre-baking at each step before applying the next layer. But holding off the developing stage until the final combined multiple-layer stack is completed.

Alternatively, with nanolithography transfer methods (also described elsewhere) a pattern can be directly introduced into the film, for example by stamping a master on the film surface before the film polymer has cured.

The result of all these methods is to imbue the film layer with additional functional properties (such as are described here including: diffuser, fresnel lens, prismatic light-turning film, Brag filter, diffraction grating, wire-grid polarizer, bat-wing de-focuser etc).

In an example embodiment per FIG. 12, a sawtooth pattern (50 um spacing, with 12 um apex) was applied in a layer of SU-8 mixed with red nanoparticle, using the nanolithographic transfer technique previously described.

The functional film illustrated in FIG. 12 behaves as follows as prismatic structure was formed which can both color-convert, as well as functioning as a diffracting optical element.

The process can be used to create apparatus as per FIG. 14, with combined materials in one layer, or segregated layers that perform additional functions in combination, or separate functions per layer.

In other embodiments as per FIG. 15, the depressions created by transfer stamping are filled with a polymer material, enhancing the efficient refracting of light within the structures, and enabling the combination of additional functionality. Example embodiments of multi-functional optical films include those such as a prismatic light turning film, Fresnel lens collimator, Bat-wing diffuser, Brag diffraction grating, and others will be familiar to those versed in the art of Photonics and Optics.

In one embodiment as per FIG. 16, the functional stack is again coated with resist and material, and using lithography or sputtering (other deposition techniques as are also applicable), creating a metal grid in the unmasked areas.

In the case of sputtering, a sacrificial mask covers the surface, while the sputtered metal vapor deposits on the surface, leaving the desired pattern such as the wire-grid polarizer of the example below.

The disadvantage of spin-coating is that more than 90% of the material will be spun off and is difficult to recycle, and other method can be more effective in pin-point selective-area application. Including Ink-Jet printing, and 3D-printing.

Nanolithography Pattern Transfer

In Ink-Jet printing, the nanoparticle is mixed with a volatile suspension fluid. In the case of nanophosphors the carrier fluid is not necessarily required to provide oxygen barrier (as is the case for Quantum Dots), and is simply a binding and fixing agent, to enhance attachment to the surface, and/or protect the material from abrasion.

3D Printing Process

In 3D-printing the various approaches have included a bath containing a mixture of particles and UV curable resin. Typically, the resin bath is exposed from underneath to a UV light that passes/obscured by a pattern, causing the resist to cure.

Use of Deep-Red, NIR Laser

In some embodiments the use of UV light is difficult because of the high excitation by UV and subsequent re-emission by the nanoparticles being patterned. In effect the particles scatter the light that is being used to pattern them defeating the ability to cure the resist. In an embodiment, the use of a resist which are photo-sensitive to IR and NIR light is anticipated, and can be accomplished using a Red/NIR/IR laser or LED for patterning, and a solution comprising NIR resist material (e.g. https://www.allresist-.com/photorestist-other-resists-resists-for-near-infrared/).

Laser Silk-Screen Process

In one embodiment the patterning is accomplished using the laser lithography method wherein the pattern is directly etched into the resist using a highly precise laser which has X-Y (and/or Z) positional control to "paint" the pattern, and a fine focus point e.g. sub-micron. Such a process has the advantage of not needing a mask, and can help avoid issues of particle scattering of the exposure light, interfering with the pattern.

MicroLED Patterning Process

The process disclosed illustrates, as per FIG. 17, a method for patterning nanoparticle conversion material onto an MicroLED structure for the purpose of color converting from a blue, or deep-blue emitter.

In one embodiment, a transparent substrate is prepared for patterning. The process begins with a resist that forms a pixel matrix (which as described elsewhere may be a rectangular, honeycomb other regular shape)

In one embodiment the surface is treated to improve cohesion, and the resist is spread evenly, for example using spin-coating. A preformed black matrix may be overlaid, or the matrix itself formed through the process of patterned resist, exposure, develop.

In other embodiment, the matrix is created by filling the mask with a mixture of color particle, photoresist and solvent.

The mixture is exposed to UV under a mask, the assembly is optionally heated to assist curing the photo-resist, and causing the exposed areas to resist reacting with the etch chemicals. Additional color material and photoresist are applied and the process repeated for each additional primary color e.g. red, green, cyan.

Additionally, a non-converting light diffuser element (such as Titanium Diode, Aluminum Oxide, Zinc Oxide) may be applied in areas which are intended to pass blue (or cyan etc), in order to create a blue (or cyan) sub-pixel radiation pattern that matches the emission from other colors.

Walled Microstructure and CMP to Ensure Uniform Material Distribution

A micron sized walled shadow-mask structure is formed around a sub-pixel array: rectangular, triangular, hexagonal grids. The walls formed via a number of techniques are encompassed in this invention, including via photo-lithography using resist and patterned exposure. In another embodiment, the walls are formed by ablation of the surface using oxygen plasma.

The walls contain color conversion material during the application stage (photo-lithographic patterning), and provide a light barrier, preventing the photons of neighbouring sub-pixel elements from exciting the adjacent sub-pixel material. The grid openings inside the walled area are located over the desired emission area of each sub-pixel. In one embodiment the walls are on the sapphire surface on the emission side of MicroLED substrate, and surround each MicroLED sub-pixel. The walled area may be larger than the emission area, and leverage internal reflection within the layer to disperse photons entering the film, and thus enhance the color-converted emission aperture through diffused radiation.

The grid walls are employed to a) initially trap a roughly consistent, and relatively even amount of nanoparticles when filled, and then b) establish an exactly equal amount when subsequently leveled e.g. etching to remove a specific amount of wall depth; via abrasion of the surface by a flat plane (grinding wheel); or other surface ablation methods otherwise widely known in the industry as CMP (Chemical Mechanical Polishing).

When leveled, the grids contain a uniform particle amount, regardless of any non-uniform difference in material filled into the grid (with spin, spray coat, ink jet, silk-screen, lithographic, or other approaches). The uniform amount of color conversion material ensures a uniform color per pixel. In one embodiment, the grid area for specific color materials is enlarged or reduced relative to other color grids, leveraging internal reflection and scattering to create a different sized emission area relative to the excitation source, in order to adjust the amount of specific color conversion on a per-color channel basis e.g. to adjust for differential efficiency of color conversion between materials.

Walled Structure in MicroLED Wafer

In some embodiments as per FIG. 18, the epiwafer is reversed, to use the sapphire side for the emission. To ensure the light from other emitters does not transmit through the sapphire, and excite the neighbouring sub-pixels, the sapphire surface is etched (for example with oxygen plasma etching) to create trenches deep enough to cut through to the opaque underlayers. An opaque filler material is applied into the trenches to form photo-spacers. In some embodiments, additional registration posts are added to the surface to aid in aligning the conversion layer and accommodate for stretching or other misalignment.

The patterned layer is bonded onto the prepared surface. Then the assembly is bonded onto the backplane containing the driving circuits.

Note the embodiment above demonstrates implementation of registration posts in the substrate surface and complementary registration holes in the conversion surface. In alternate embodiments the posts and holes may be swapped, and opaque photospacer may be leveraged as the means to achieve consistent registration of the layers (emitter sub-pixel to converter sub-pixel) when combined. In an embodiment, the photo-spacers extend from one surface into the other, and function as the registration mechanism.

High-Functionality Nanopatterned Film Apparatus

In US Patent App US20170269279A1, an assembly of multi-passband reflective color filters is described, with a key benefit being the transmission of light wavebands desired and reflection of other wavelengths for efficient recycling. With the combination nanoparticle patterning and functional color converting materials it becomes possible to create color filters from structures that both convert light, shape and filter the light generated, at much smaller dimensions, even down to sub-pixel sizes.

Nanoparticle converters are key enabling technology in the creation of new class of applications, however issues with QD nanoparticles have limited their applications e.g. most QD's are sensitive to UV light and thus not amenable to photo-lithography and UV-activated photo-resists. The pixel in a typical display system is in the 50 um to 10 um and going smaller with retina[8] and near-eye displays. For example, a monochromatic laser-printed page has 400~1000 pixels-per inch (ppi), while the display on an Apple Watch has 300 ppi, and an iPhone has near 500 ppi. Generally, the close to the eye the finer the pitch needed, and for AR displays over 1000 ppi MicroLED display is a common requirement. But given each pixel has 3 color sub-pixels: red-green-blue, the dimensions of the sub-pixels are between 50 um to 8 um, which is outside the feasible patterning range of phosphors which typically have a wide-ranging particle distribution from 5~30 um in size. Micron and sub-micron nanopatterning, with Nanophophors, has been reduced to practice, however the nanoparticles described herein are not restricted to nanophosphors, and could include robust QD's (e.g. tetrapod or cuboids) or a hybrid of QD's and nanophosphors. As well as application processes where the nanophosphor particles are patterned with photo-lithography, or ink-jet printed, or a hybrid of both e.g. where the larger structures are layered or ink-jet printed from QD's.

[8]Retina Displays https://en.wikipedia.org/wiki/Retina_display

Described in FIG. 19, and herein are structures to leverage the opportunities of structured meta-materials enabled by functional nanoparticles. In particular, the efficient rejection of excitation wavebands by reflecting filters enables more efficient color conversion with thinner-layers/smaller-amounts/reduced-densities of conversion materials. Combining reflective polarization functionality, in addition to color conversion and/or filtering, allows for even more efficient recycling, and a display system with fewer layers. Photonic lattices (array of holes) can also form efficient collimators, replacing the need for the BEF/DBEF layers which are normally used to direct light towards the viewer.

This disclosure will not detail the principals of operation, nor math in computing nanostructure dimensions for wire-grid polarizer (WGP) or color filter—they are well known to those versed in the art of photonics and plasmonics and there are multiple published works on the use of nanopatterning to create said structures. For example, in Luo et-al[9], computing the dimensional 1D grid incorporating a nanopatterned WGP is described for 1D grid that simultaneously polarizes and filters. However, what was not anticipated in prior art was the advent of robust functional luminescing nanoparticles, which open new possibilities of integrating higher-order functionality, as per FIG. 20, including:

[9]Luo et-al, 2015, "Polarizing grating color filters with large acceptance angle and high transmittance" http://dx.doi.org/10.1364/AO.55.000070

1. Photonic structured color-filters tend to work best in reflective mode (e.g. colors reflecting off a butterfly wing), but are very poor filters in transmission mode (filtering light passing through). The combination of patterned color converter, on top of the patterned filter leverages the reflective mode operation of the filter, reflecting unconverted (e.g. blue/cyan) light back into the color converter (as well as into the display backlight module as in the prior art), for more efficient direct color re-conversion. By reducing the off-CWL primary color light transmitted through the stack to the color filter (e.g. blue or green photons entering into a red sub-pixel) also allows reducing the color filter thickness, which also enhances efficiency.
2. The functional elements are patternable directly on top of the color converting particles enabling the combination and polarizer and into one layer, reducing overall thickness.
3. The new capability of nanoparticles to fill gaps between conductors forming a dielectric element of the structure as well as color converter, for hybrid dielectric/conductor plasmonic structures.
4. The functional nanoparticles can be patterned in photonic structures such as photonic lattice (array of holes) which functions as a collimator, directing and reinforcing light in the forward direction towards the viewer, and effectively fulfilling the role of the BEF/DBEF layers.

Various modes of operation of meta-material structures of nanoparticles are described herein, leveraging operation in diffractive, waveguide, plasmonic, and photonic structures, however other modes and structures are anticipated.

In one example MicroLED embodiment as per FIG. 20, the color converting materials are patterned over the blue emitter to create red and green sub-pixels. In some embodiments the layers may additionally contain alternating layers with a different refractive index of binder, polymer substrate, and/or color converter materials, creating a reflective filter (e.g. a Distributed Bragg Refractor, DBR) that permits the transmission of longer wavelengths, but reflects shorter blue-wavelengths forming a dichroic reflective color filter configured as a long-pass or band-pass filter to pass longer wave-bands). In some embodiments, the underlying MicroLED has a reflective backing (e.g. Silicon Backplane), such that the unconverted blue light will be substantially reflected back, and re-enter the color conversion layer. In one embodiment, the DBR is pre-ceded by a light collimator, for example a Fresnel lens array, so as to align the light incident angle for maximum filter efficiency (out-of-band rejection. In one embodiment, the reflective filter is followed by a diffusing layer, such as a $TiO_2$ nanoparticle mixture, so as to effect a more Lambertian radiating pattern for a better viewing angle. The recycling with reflection can improve efficiency by enabling unconverted light to be recycled within the structure until converted. Thus, the arrangement using the color conversion material can perform multiple functions including (but not limited to): conversion, filtering and recycling light.

The refractive index of nanophosphors disclosed herein (e.g. Nitrides and Silicates) has been determined to be in the order of n=1.8~2.0 making them useful for providing contrasting refractive index when coupled with air or with other transparent materials such as silicone polymer (n=1.38~1.6), or glass (n=~1.52). Computing the waveguide diffraction structures is outside the scope of this disclosure however know to anyone skilled in the art, for example Nawrot et-al[10] illustrates similar structures using laser photolithography in a single substrate material, but lacking the integration of the functional nanomaterial.

[10]Nawrot et-al, 2013 Optics Express "Transmission phase grating fabricated with direct laser writing as color filters"

In one embodiment as per FIG. 21, the nanoparticle is patterned to produce a 2D array of pillars on top of a substrate (no), forming a phase grating waveguide that functions as a color filter. The array has uniform regular spacing in X and Y axis and leverages the large difference refractive index of the material, forming a Bragg diffraction grating.

In one embodiment, the spacing of the pillars is 2× the center wavelength, while the height of the pillars is 4× wavelength, meaning the green is 1.07 um spacing, with 2.14 um height, while the diameter of the pillars is 1× wavelength. The excitation blue light enters the array, and blue photons are converted to the target color, but emission is filtered by the constructive interference within the waveguide such that majority of unconverted blue is reflected, and the target wavelength is favoured for emission. Other geometries are possible and comprehended in this approach, including shapes other than round pillars (e.g. rectilinear), and inverted arrangements (e.g. the pillars are holes, in a substrate of nanophosphor), however the regular grid phase structure is preferred and is superior to the simple 1D grid for is stronger angular tolerance which translates to less color shift over viewing angle. In another embodiment, the substrate (labelled no) is: one or more phosphors, or nanomaterial, or combination of materials; and the pillars are patterned from a material with suitable refractive index.

Additional embodiment are anticipated, such as in FIG. 22, wherein the array dimensions are roughly the target wavelength size, and where the dimensions are sub-wavelength are also anticipated. Sub-wavelength structures benefit from the plasmonic interaction with light wherein the electric field portion of the light interacts with the dielectric and conductive elements of the structure to create an efficient reflector for wavelengths not of the target range. However, the smaller wavelengths require a finer grain of nanoparticle material which increases cost.

In an example embodiment, the structure is inverted where the waveguide elements are formed from an array of conductive members (e.g. the metals group such as Al, Au, Ag, and also conductive polymer matrix hosting inorganic particles), and the conductive member are arranged according to the wavelength and sub-wavelength dimension required. The diagram illustrates an example embodiment where the substrate (labelled no) is the phosphor or nanomaterial, configured in either an array of materials (e.g. array of red, green etc corresponding to the select color) or combination of materials (e.g. a mixture of phosphors or nanoparticles), and the pillars are patterned from a suitable refractive index or from a suitable conductor and dielectric (to leverage the plasmonic interactions).

The diagrams in FIGS. 20, 21, and 22 are representational and not exact models, but are sufficient to convey the concept to enable one of ordinary skill in photolithographic processes to design a methodology around the core structural concepts. For example, the space between the structures is anticipated to be filled with transparent polymer. The space between color sub-pixel elements is typically filled with an opaque material, or photo-spacer, or a patterned black mask.

The sub-pixel structures may be formed on the material or on a substrate such as glass or plastic. These are anticipated depending on the mode of construction, and the processes applied. in one embodiment, the metal wire grid is patterned on glass, and then filling the gap with transparent dielectric polymer and then another process of lithography to apply the color converter.

To enable the plasmonic effects, that cause the WGP to reflect waves not of the desired polarization, the spacing between the metal wires is filled with a dielectric, ideally one that does not scatter or alter the polarization of the light transmitting through the WGP and has a refractive index matching the layers so as to minimize losses through total internal reflection (TIR). In one example the array of posts is applied through patterning, and then the metal applied on top forming a slanted grid, the gaps are filled with transparent dielectric. In another embodiment the wire grid is applied by sputtering metal vapor onto the surface covered with a mask that is a negative of the matching grid pattern.

In one embodiment, the spacing between the alternating refractive index materials is based on the "Bragg wavelength" ($\lambda=2n_c\Lambda$), such that blue light entering the converter is reflected back into the conversion layer, limited from passing-through, and In another embodiment, elements of the color array are color-pass-through elements, or consist of filters with sufficiently wide bandwidth to allow the target wavelength(s) (e.g. blue, or blue and cyan, or red~blue) of the backlight to pass through, and may include additional diffusion or polarizing functions. For example, in the above diagram the cyan element may simply consist of a neutral light diffusing nanoparticle, such as $TiO_2$, in a transparent polymer, such as silicone which will pass-through the backlight when in cyan or blue mode and diffuse in a radiation patter similar to color conversion particles.

In an embodiment illustrated in FIG. 23, the array is designed from conductive metal (such as Al, Au, Ag, MoW Molybdenum alloys) in dimensions forming a wire-grid polarizer such that the elements emit strongly light strongly polarized in the axis of choice, and reflect back polarized light not desired, for subsequent optical recycling (for example, refracting and reflecting into light harvesting and recycling structures) and re-conversion (for example color converted). In another embodiment, the grid spacing is alternated to manifest the sub-wavelength plasmonic filter effects necessary to perform as both filter and polarizer.

Electroluminescent Emitter Using Nanophosphor Layer

There are two basic kinds of Electro-Luminescence:

Intrinsic

Charge Injection

The key difference being that in the former method there is no net flow of current, whereas in the latter electroluminescence is the direct result of current (electrons) flow through the material.

Intrinsic Electroluminescence

Phosphors are by nature typically dielectric materials, that do not readily conduct electric current. Electroluminescence in phosphors can be generated from applying a large electric field potential (as well as mechanical, thermal stress), which liberates available electrons to move into conduction bands under accelerated electric field potential, hitting the phosphor crystal imperfections/activated centers, and causing the emission of light. Similar in end-result, to the color-converted emission from high-energy photons excitation (photo-luminescence).

Since this process dies shortly after all the available electrons have hit the activated centers, a one-directional DC current does not result in a sustained emission. However, by using a high-frequency Alternating Current (AC) potential on the electrodes (creating the electric field around the phosphor sandwich), the continuous forward and reverse flow of electrons and collisions, results in the continuous emission of light.

Electro-Luminescent (EL) lights and displays, such as TDEL (thick-dielectric EL), TFEL (thin-film EL) designs have many advantages over other types, for example:
high efficiency, and low thermal profile
are robust and stable over wide operating range
(like OLED) have a very high contrast ratio, and are fast switching
(like OLED) can be layered on thin flexible substrates
(unlike OLED) they are based on inorganic materials, and last almost indefinitely
Are based on capacitance, and as such can integrate In-cell touch, and capacitive biometrics One of the challenges in EL display adoption, has been the difficulty making an efficient blue, as was considered necessary to make an R-G-B display; however, in this disclosure, a cyan phosphor (Barium Silicon OxyNitride doped with Europium) is leveraged to create an efficient cyan EL emitter which combined with the techniques for color-space conversion enable rendering of much of the visible color gamut. In addition to the aforementioned benefits of using cyan (eye-safety, luminous efficiency), the cyan based pixel additionally requires a lower AC voltage than blue phosphors (Earth-Alkaline OrthoSilicate $Sr_2/Ba_2SiO_4$:$Eu^{2+}$, and $BaAl_2S_4$:$Eu^{2+}$) for an equivalent brightness, which results in a simpler EL construction.

In the diagram of FIG. 24, a blue sub-pixel is shown, but is not required. The cyan can suffice, assuming a sufficiently short-enough-wavelength CWL for the cyan (e.g. 475 to 495 nm), the C-G-R combination is enough to achieve an eye-safe white suitable for display use, with reasonable color gamut. However, other embodiments and other combinations anticipated, including a yellow, as in a C-G-Y-R or B-C-G-Y-R for a larger gamut and improved efficiency.

In prior art EL panels, the panel thickness and flexibility was dominated by the phosphor layer, which must be thicker due to inconsistency of particle dimension. A thinner layer would suffer from wide difference in particle distributions across the screen leads to non-uniformities across the display image (aka "Mura"). With past phosphor particles having a wide distribution in size 5~30 um, this limits the minimum thickness of the phosphor layer, and the minimum pixel size. If the color sub-pixel feature area is too small, it can have an inconsistent amount of phosphor, leading to inconsistent brightness, and mura & color artifacts.

Disclosed herein, an embodiment leveraging the nanoparticle color phosphors, coated over the dielectric surface using the aforementioned nanopatterning method, with the pixel structure methods described. Apart from the consistency in the thinner layer, this method additionally affords the ability to form separate channels of phosphor within each sub-pixel as illustrated in the diagram of FIG. 25.

In one embodiment, the electrode is divided over each channel, creating capacitors in series as well as in parallel. In one embodiment an additional dielectric separator is placed between the channels, however other embodiments with orthogonal layout and contiguous channels are also anticipated. In one embodiment the back electrode is the common, however in other embodiments the transparent top electrode is common, and the back electrode is separated. In another embodiment a dielectric is filled between the channels. In another embodiment, the phosphor is a contiguous mass, where only the electrodes are segregated.

In another embodiment, the highly efficient Cyan is used as an excitation source to excite a secondary phosphor color converter as shown in FIG. 26.

In another embodiment as per FIG. 27, the phosphor is a contiguous mix of emission peaks for example of blue, cyan, green and red and color filter are used to separate the colors in a configuration similar to W-OLED. The advantage of this approach being that the inner phosphor layer is extremely simple contiguous layer, and requires no patterning. As disclosed elsewhere a cyan element in the color filter can ensure the output produced includes an eye-safe night time spectrum, and accompanied by a pass-through white element, or even a blue and yellow element (matching the emission peaks of the materials selected).

In some prior art EL displays made use of pixels based on a white phosphor mix, and adding a finer resolution color-filter, similar to a W-OLED display.

In one embodiment as illustrated per FIG. 28, a mix of the nanophosphor particles is applied within a thin continuous layer within a white emitting EL stack. Behind the structure is a transparent electrode over a reflector to catch light headed in the wrong direction and steer forwards. Note that alternate embodiments are anticipated that exchange these layers for example using a TiO2 diffuse reflector coated on the lower dielectric film. Additionally, the lower conductor could be formed from a transparent ITO or Carbon Nanotube layer on the lower surface of the dielectric. Other combinations are anticipated, and will be obvious to anyone skilled in the art.

In FIG. 29 is an embodiment illustrating the emission surface the top electrode is formed from a nanopatterned metal (e.g. Al, Cu, Au, Ag, MoW) that functions as a wire-grid polarizer (WGP), layered on top of the cover-layer dielectric (e.g. glass). On the reverse side of the cover layer, a nanopatterned photonic lattice pattern of holes (alternatively pillars) is arranged to form a collimating meta-surface that steers light forwards towards the WGP.

When arranged as an LCD display backlight, the layer allows eliminating many of the existing layers: Polarizer #1 is replaced by the WGP, while the functionality of the DBEF is replaced by the photonic lattice. The phosphor material and encapsulant itself forms an effective diffuser, however other nanomaterials such as TiO2 may be added to the layer to increase color-neutral diffusion. An addition benefit of the EL layer, beyond the reduction of layers, is that unlike the standard LCD light guide, the EL layer is flexible and foldable.

Previous use of EL lighting as LCD backlight has not been as successful due to its relatively low brightness compared to LED's. However, in this embodiment the configuration to emit strongly polarized light effectively doubles the brightness of the EL backlight.

In one embodiment the backlight plane consists of segments, such as rectangular sub-areas, which are driven separately, forming a regional backlight. The nanopatterning facilitates reduction in area down to the pixel level to create an LCD display that uses EL backlight in a manner similar to a MiniLED 2D backlight, but thinner thanks to the thin nanoparticle phosphor layer and the reduction of other layers in the LCD optical stack.

Charge Injection

The disclosers have discovered that nanophosphors, when evenly coated in sub-micron thickness layers, exhibit an unexpected characteristic: the ability to behave (like Quantum Dots, Perovskite Salts, and organic phosphors) in a charge injection configuration, and emit light as a result of direct electric current—without the use of high-voltage, high-frequency alternating field, as in Intrinsic Mode electroluminescent light-emitting elements. In retrospect, this outcome may seem obvious, particularly given recent developments in charge injection configurations of Perovskite Salts, which are a close-relative to inorganic Phosphors, but is nonetheless an exciting development, and the discloser is not aware of any prior work in this area. This also leads to the inverse modality: the generation of electrons and electric charge, in response to excitation from photons—as is disclosed in the section on application to Solar Cells.

Without constraint to any specific theory, the discloser believes this is the result of the charge carriers at the crystal imperfection sites being more accessible at the Nano-scale, whereas previously the micron-scale material presented a large distance for electrons to traverse, across a high-dielectric inorganic insulator, in order to reach an activated site, thus requiring a larger voltage potential to cause the necessary electron flow.

In essence, this configuration of nanophosphor leverages the activator band-gap (a similar configuration to a QLED/OLED), and thus it can be considered a nanophosphor light-emitting diode (NP-LED) with sub-pixel color elements as per FIG. 30.

Various configurations of the layers will be familiar to those versed in the art of OLED, QLED, Perovskite. However, the use of Inorganic HTL and ETL is a particularly exciting aspect, providing additional robustness. In one embodiment, a suitable hole-transport layer (HTL) material is applied as a thin layer over the nanophosphor, for example using a Nickel-oxide (NiOx) nanopoarticle layer, doped with Lanthanum to improve charge carrier mobility.

It should be obvious to those versed in the art that the above diagram represents a simplified cross-section, and is not restrictive of various sub-pixel colors or arrangements, red-green-blue and red-green-cyan arrangements are also comprehended. In one embodiment, a black opaque photo-spacer is injected between sub-pixels to prevent cross-talk, for example prevent blue & cyan sub-pixel emissions from exciting the material green and red sub-pixels.

The following are example sub-pixel arrangements proposed to embed the additional primaries, in geometries that are also efficient in reducing fill-factor, and optimizing color gamut with eye-safety as per FIG. 31

Mufti-Layer MicroLED on Transparent Substrate for Light Field Display

An embodiment of a display consists of an array of MicroLED's arranged on transparent polyamide substrate layers. The layers are stacked one on top of the other. The MicroLED's on each layer are spaced sufficiently to allow lower layer MicroLED to emit rays through the layer above. In between the MicroLED's, a ray-steering structures provide focusing and per-ray control, with each layer providing one or more angular tilts per layer. The resultant 3D structure forms a 3Dimensional display capable of generating a light field, increasing the number of layers increases the number of unique ray-directions.

Fresnel surface structures, lenses and prismatic light-turning structures (similar to light turning films) are suitable for collimating, focusing and steering of the rays, however other structures are anticipated including nanopatterning of meta-functional surface structures.

In one embodiment as illustrated in FIG. 32, opaque absorbing materials are patterned in areas underneath the layers, and between the structures, to capture reflecting rays and block rays from interacting with structures above and to the sides.

Nanolithography Surface Structure on MiniLED to Form a Bat-Wing Diffuser

In one embodiment the MiniLED array has an upper emitting surface patterned with a micron/sub-micron structure forming a light shaping structure. The structure may be imprinted on the die, for example on the transparent sapphire substrate for a rear-emitting LED die, or on the surface, or on a layer placed on-top of the die e.g. a glass or polycarbonate substrate.

With MiniLED backlights, the thinness of the backlight layer is a critical aspect of system design, however without sufficient height to introduce diffusing layers or typical optical diffusing structures (e.g. lens) the emission remains narrow and this leads to gaps in illumination uniformity between MiniLED emitters, and in turn mura: display non-uniformity.

One embodiment structure illustrated as per FIG. 33, is a "bat-wing diffuser", which operates to reduces forward emission to a minimum and deflect rays towards the sides (in a bat wing shape). Another embodiment forms the diffuser directly on the MicroLED surface using nanolithographic patterning in the GaN or sapphire material. The diffusing structure may for example be a Fresnel lens formed from concentric rings of alternating refractive index material.

Dot Projector Based on Sub-Micron lithography Collimator, Pin-Hole Array and One/Two Grating DOE In one embodiment, a high-power LED pattern projector is formed from the array of quantum wells across a planar surface, and arranged in an optical stack designed to project a fine resolution dot over both short and long distances. In one embodiment, the LED is an infra-red emitter device, such as in or around, the 940 nm water-vapor waveband. The wavelengths associated with atmospheric absorption of infra-red light by water molecules, which leads to an absence of ambient light interference in this waveband; making it an ideal waveband for the use by artificial-light 3D pattern projectors for machine-imaging. Alternatively, the 1150 nm waveband is also preferable, due to its position in the wavebands that is both low in ambient emission, and importantly: is directly absorbed by the structure of the eye (the fluid in particular), and hence wavelengths in this range present a low risk of retinal damage, even at high power. One of the problems with existing solutions in this space e.g. VCSEL and Laser Diodes are the high-cost, and difficulty creating a high-power broad emitter. Presented herein is an emitter capable of leveraging low-cost high-power LED for the same result.

Similar to VCSEL 3D dot projectors, the end structure is a Diffraction Optical Element (DOE) which may in one embodiment be an array of slits forming a diffraction grating along a single axis. In other embodiments additional gratings along opposing axis can be combined to form additional dimension of dots. Other forms of diffraction patterns are too numerous to list here, but other slits/gratings/holes and diffraction patterns are comprehended by this disclosure.

As described in this disclosure, the light collimating structures are capable of being layered on the die (or on the sapphire substrate, or on layers placed over the die . . . etc), to modulate the emission pattern of the quantum wells. In this case, the nanopatterned structures are arranged (SLCS)

to affect a collimation of the light that normally radiates in a Lambertian pattern. Ideal collimating structures include a square-walled matrix nanostructure, a forest of tubes, and a honeycomb grid, wherein the size of the grid/matrix is less than that of the wavelength of the light being transmitted this can be deposited using photolithography methods described elsewhere in this disclosure.

Infra-red LED's tend to have a very wide emission waveband, >35 nm FWHM for 850 nm, and >60 nm FWHM for 940 nm CWL. When creating a pattern via diffraction element, such as a dot pattern of constructive interference, the FWHM is important since the wavelengths around the CWL create constructive interference points at a spacing relative to their wavelength, this a wide FWHM causes offset dots introducing a blurring effect on the dot size. In one embodiment, a band-pass filter is arranged somewhere within the optical stack to constrain the FWHM, and thus the size of the dot.

In a preferred embodiment illustrated in FIG. 34, the filter is a high-efficiency reflective type (e.g. a dichroic filter or Bragg reflector), which reflects wavelengths, not of the pass-band, back into the assembly to be absorbed. In one embodiment a strong IR-absorbing material (such as Vanadium Dioxide), is coated in the surfaces which will receive the rejected IR light wavebands. In another embodiment, light is recycled via surfaces coated with anti-stokes phosphors, which convert IR into higher wavelengths, whereupon it can be down-converted to the desired IR waveband with an IR emitting phosphor (as described in Wyatt, US Patent App US20170269279A1).

In an embodiment, a collimating structure is formed from an array of tubes (PGA) in an opaque metal or dielectric substrate. In one embodiment the holes are cut via laser to be narrower than the wavelength of the IR being transmitted and arranged at regular intervals across the surface to maximize IR light transmission. The hole-array forms a Photonic Lattice, the metal or dielectric substrate creates a plasmonic surface which interacts with the electric field of incident light waves, reflecting light rays not substantially at a normal to the surface, and passing though light which is at normal. In one embodiment light which was reflected, is bounced back and harvested, for example: reflected light re-enters the IR emitting die, and is refracted by the die substrate, such that it may be reflected by the edges, or pass through to the reflector placed behind the die, where it is re-directed towards the PGA, thus recycling light rays not collimated.

In this disclosure the term "ePaper" refers to the category of non-emissive displays, which functions like paper, creating contrast by reflecting/absorbing ambient light, under pixelated electronic control. Such displays depend on ambient light, or a frontlight, to be viewable. Examples of ePaper displays are made by companies such as eInk[11], ClearInk[12] and Bodle[13], all of which fundamentally rely on the absorption or reflection of ambient light. These displays are extremely power efficient requiring very little energy to alter the pixel state, and are typically able to retain the state without continued power (like paper).

[11]eInk https://www.eink.com/color-technology.html
[12]ClearInk https://www.clearinkdisplays.com/technology
[13]Bodle https://www.e-ink-info.com/meet-srd-bodles-e-paper-display-technology-based-pcm-materials Historically R-G-B color has been achieved through the use of color filters as per FIG. 35, which introduce heavier losses than emissive displays since ambient light must typically make two passes through the color-filter: one to enter the reflect/absorb sub-pixel, and another pass to exit. The losses in this process create low color gamut and low contrast ration, and is one of the key reasons limiting the application of ePaper display, thus a solution to make more vivid high contrast color is strongly desired.

Electrophoretic displays operate by moving micron-sized (0.5~1.5 um) color pigment particles contained in microcapsules, via an electrostatic field. The types of particles can use alternate color(s) e.g. Red, creating a tri-state: Red, White or Black. Wherein one type of ink particle (capsules) in the pixel, absorbs non-red ambient light wavelengths, and leaving red as the only color reflected.

In the prior art as per FIG. 36, multiple colors have been achieved through the use of color filters, or multiple color particles and multiple field voltages. In the latter scheme a selected voltage enables the red particles to rise closer to the surface, while keeping the white particle at the back. The complexity of tailoring more than two color particles, and driving multiple voltage, makes it slower to refresh and difficult to create more than 2 colors in these Electrophoretic systems. However, the use of color filter greatly diminishes the contrast ratio and brightness, since light must pass through the filter twice, once to enter and again to exit after being weakly reflected.

In the example of Bodle, the display pixels are formed by phase-change material which operates as a reflective colorfilter. Each sub-pixel offers a binary choice of colors depending on on/off state e.g. an element that alternates between absorbing blue or green light, can be used create a sub-pixel that alternates between magenta or yellow. By combining multiple combinations of color filters, in a per pixel arrangement, it is possible to create a full-color display.

In all of these systems, low-light and night-time viewing is enabled through the use of a frontlight, typically with an LED light source conducted over the surface through a light guide plate. The light source in these frontlit systems is typically a low-cost thin LED, using a blue GaN diode, and YAG phosphor, for example the following is the spectrum captured from a Kindle Paper White device based on an elnk display using Seoul Semiconductor 0.6t YAG LED.

Emitter Material in an Emissive Color Filter for a Reflective Display

In one embodiment of a reflective display, as illustrated per FIG. 38, micron and/or nanophosphor particles (such as disclosed herein) are patterned in the color filter forming an emissive sub-pixel primary color array configuration. Such an embodiment may be configured to receive the excitation from light exiting from the reflective-display pixels and convert into the desired primary colors. And may optionally include a color-filter to reduce excitation from ambient light.

In one embodiment, the frontlight is optimized for excitation of the material, for example using wavebands substantially within the materials excitation range, or with higher-energy excitation diode at a shorter wavelength, for example 400~415 nm, which is in a less-hazardous eye-safe waveband range. An additional long-pass, or bandpass, filter may be implemented to minimize excitation light from escaping, and disrupting the color mix. In an ideal embodiment such a passband reflective color passband filter as described in Wyatt US-patent US2017/0269279, is used to enhance recycling, and thus overall efficiency.

The above diagram illustrates the role of an emissive color filter in an TIR ePaper display such as that from ClearInk. However, it should be obvious to anyone familiar with the reflective display technology, that similar techniques can be applied to other ePaper screens, such as elnk or Bodle or other.

Emitter Material in the Sub-Pixel for the Reflective Display

In one embodiment, micron/sub-micron (nanoparticle) color conversion material is included in the fluid (non-conductive and transparent e.g. oil) inside capsule of the reflective display sub-pixels. The particles are electrostatically charged, so as to co-exist with other particles in the capsule. This can be accomplished with the addition of chemical coating, adding an ionized shell (e.g. via the sol-gel or Stöber methods described herein), though ionization in a plasma, bombardment with electrons, or other ionizing techniques well known to those versed in the art.

In one example, the emissive particles are given an electrostatic charge opposite to the black particle (broadband absorbing), or white particles (broadband reflecting), such that when a pre-determined combination of electric fields are applied, the color-conversion particles move to the top of the capsule, or to the bottom. In another embodiment, the conversion particles are configured to remain neutral, while the absorptive ink particles are charged and move to displace the color nanoparticles when subjected to electrostatic field.

As illustrated in FIG. 39, the frontlight is operable as the excitation source for the color conversion particles, and ideally in an eye-safe high energy range A front long pass filter may be employed to block light escaping. In another embodiment, where the frontlight is disabled or not employed, the daylight is used to excite the particle color emission producing blue, cyan, green and red colors. In one embodiment the excitation source is narrowband eye-safe emission, and the sub-pixel materials include blue, green and red color conversion material, however cyan and yellow are also anticipated.

In another embodiment, no long-pass filter is included since the excitation source is one that can be used in combination with blue, e.g. a combination of white (reflects blue) particles, and green and red color conversion material.

In one embodiment, the nanophosphor emitter material is contained in the reflective/absorptive element of a reflective display, where it is stimulated by either by ambient light (daylight contains enough blue to stimulate emission), and/or a frontlight. In one embodiment the frontlight is chosen from an eye-safe waveband in the non-hazardous region e.g. around 400~415 nm, and 470~510 nm, and at least one of the particles is configured to reflect/absorb the frontlight waveband without conversion (e.g. without altering the spectrum or down-converting to another color). In one embodiment such a display has a sub-pixel configured with $TiO_2$ or broad-spectrum reflector ink compatible with ePaper application. Other embodiments configured with red, yellow, magenta, green, cyan or other color sub-pixels are within the scope of the disclosure, and nanoparticles. In other embodiments the mix includes nanoparticles which are highly absorptive[14] to short wavelength light sources. In some embodiments the color conversion nanoparticles are treated to induce electrostatic interaction compatible with usage in the ePaper display, in other embodiments the particles are activated (e.g. such as bonding with an ink particle) so as to become electrostatically active and serve in both emissive and passive modes. In either embodiment the resulting particle is embedded in the micro-capsule (elnk) or within the TIR layer (ClearInk), or in the underlying reflective backplane (Bodle phase-change) with particles, and operable to interact within the field.

[14]Nanoparticlehttp://technologvlicensing.research.ufledu/technologies/13972_nanoparticle-tinted-contact-lenses-for-blocking-uv-light In another embodiment, illustrated as per FIG. 40, the frontlight is chosen from a waveband of high enough energy to drive a higher emission amplitude, and ideally remain within low hazard eye-safe range (such as 400 to 415 nm, or 470 to 490 nm). The assembly may be integrated with an optional long-pass/bandpass filter to block the excitation frontlight from leaving the display panel, such as reflective bandpass filter, or a nanopatterned color filter.

Other embodiments leveraging this approach are anticipated, including in TIR mode reflective display (as per FIG. 41), and in the reflective backplane of diffraction/interference color-filter displays (such as with the Bodle phase-change material-based display).

Emitter Material in a Reflective Backplane of a Reflective Display

In prior art system, reflective display such as a bistable LCD, or non-backlit LCD, comprises per-sub-pixel apertures which behaves as an electro-optical aperture to light, alternating between mostly transmissive and mostly opaque. Such displays share a common feature, relying on a reflective backplane to reflect incident light that is transmitted through the pixel array. In common reflective LCD's, only a single polarizer is employed such that light transmitted through the panel is reflected off the backplane and if the light has not undergone the correct polarization twist by the LC, then is absorbed by the polarizer before exit.

In an embodiment, the backplane of the display is patterned with the emissive color conversion material aligned on a sub-pixel basis, forming an array of primary colors. Incident light that passes through and strikes the backplane excites the color conversion material.

Solar Cell's

In Solar energy generation, photovoltaic converters are typically the most efficient in the mid-range of visible light spectrum, matching the band-gap achievable by Silicon. Thus higher-energy short-wavelength photons either pass straight through, or dissipate as heat without conversion.

Augmented Phosphor Conversion Apparatus

In the prior-art, it has been shown that coating solar cells with color converting phosphors[15] can improve overall efficiency significantly. Even though the particles absorb and reflect a considerable amount of mid-range visible light, the difference is made up by converting the previously unusable, higher energy UV light into the more usable yellow-green (mid) wavelength ranges.

[15]https://www.sciencedirect.com/science/article/pii/S0169433216000878

Quantum dots have also been employed in both a) light conversion approach, as well as b) in the construction of tuned band-gap from QD (rather than Silicon). But as previously noted, QD's are more sensitive to environmental factors, tend to have a shorter lifespan, and QD are omni-directional radiators sending converted photons in all directions. And QD band-gap devices are still struggling with cytotoxicity of the base materials required for efficiency and lifetime, such as Cadmium and Lead.

What is highly desirable, is to improve the efficiency of standard Silicon photovoltaic cell designs, leveraging a phosphor layer that exhibited the high-energy color conversion advantages, the robust properties of inorganic phosphors, could, but could additionally minimize losses due to reflection and scattering. With nanophosphors, multiple approaches are now possible to increase solar cell efficiency, through the addition of functional material properties that can be leveraged at these nano dimensions, for these wavelengths.

In the simplest embodiment, a layer of highly efficient nano-phosphor particles, such as Silicate or Garnets converts photons that pass through the cell, and reflects back into the Silicon junction. In an alternate embodiment, the nanoparticle layer converts photons before they impact the Silicon cell, converting into more efficient wavelengths.

In one embodiment as illustrated per FIG. 42, an activated form of $YVO_4:EU^{3+}$ phosphor is employed to leverage its very high absorption of UV combined with high transmissivity (low absorption or excitation) for longer visible wavelengths—however other comparable phosphors are applicable and well known to those familiar with the art. In one embodiment this phosphor is converted to nanoparticles for example using the milling methods described, and optionally surface coated with a UV transparent material such as $SiO_2$ or $YBO_3$, to reduce surface defects and improve efficiency.

Perfect Absorber Meta-Material

Perfect absorbers are plasmonic constructions using a thin dielectric material, sandwiched between a conductor and a conductive ground-plane, forming a resonator tuned to the electromagnetic component of light being absorbed, according to the wavelength range. They exhibit ideal absorption for the target wavelength proportional to the distance between conductor and ground-plane.

Given the nanometer size of the phosphor particles the disclosers have already accomplished the production of meta-material surfaces, and constructed a "perfect absorber" using the nanophosphors as both the dielectric, and the color converter. In one embodiment the covering electrode is a transparent material such as ITO (Indium Tin Oxide), and the dielectric (nanophosphor) layer is formed from one a variety of techniques, such as: spin coating, sputtering, vacuum deposition, photolithography, ink-jet/3D printing, or other deposition methods; to place the nanoparticle material on the silicon cell.

Where the cell is of suitable thickness, the ground plane can leverage the existing backing plate such as aluminum or copper, however other embodiments, where a transparent electrode is formed under the dielectric layer as a ground plane, are also anticipated. Other embodiments, where multiple absorbers are incorporated, for example each targeting different wavelengths, or a range of wavelengths, are also anticipated as illustrated per FIG. 43.

Semiconductor Nanophosphor Band-Gap Device

One aspect of phosphors frequently overlooked, is their native tunable semiconductor band-gap, when a high-energy photon hits a phosphor particle, the electron can be pushed to either the conduction valence band or the exciton band. Normally with phosphors, the latter is the more important result, leaving a hole-pair which can move through the crystal until collapse in a photon release at the site of an activator metal dopant.

The band-gap of the phosphor is a function chemistry, crystal shape, impurity and the doping material. For example, Terbium is strongly excited by UV and tends to emit in the green range, while Europium is more excited by deep-blue and emits in red range. However most of the Lanthanide family of rare-earth metals are suitable, and may be combined to tune the band-gap over a broader range by simultaneous introduction of multiple elements during the phosphor manufacturing process as described. For example, including Cerium, Praseodymium, Europium, Dysprosium and Terbium. One or more of these may be selected according to output wavelength, latency/response and energy band gap.

In one embodiment as illustrated per FIG. 44, a nanophosphor layer is sandwiched between a hole transport layer, and electron transport layer which move electrons between the top (transparent electrode) and the bottom backplane (e.g. Aluminum substrate). The nanoparticles may be suspended in a charge conducting material such as mesoporus $TiO_2$, or ZnO, which also exhibits excellent light dispersing and absorbing properties, however other conductive polymer matrix materials are anticipated. In another embodiment, $YVO_4:EU^{3-}$ is employed due to its very strong absorption in the UV range photons, but relative high transmissivity in other lower wavebands. In such a configuration facilitates tandem designs with other cells which are poor or affected by UV, such as combining with Silicon p-n cell or Perovskite cell—either on-top-of or underneath the companion collector.

Such a nanophosphor photovoltaic converter apparatus is ideal for capturing UV light, which is otherwise wasted, and unlike perovskite salts or quantum dots, the inorganic phosphor has lower toxicity, higher resistance to oxygen and humidity, and lower degradation due to photo-oxidization.

In another embodiment as illustrated per FIG. 45, the nanophosphor cell is combined with a regular silicon photovoltaic cell to form a tandem, or stacked cell arrangement, such as below. Wherein the silicon functions most efficiently in converting mid-range visible light, while the nanophosphor is efficient at converting UV.

Highly Functional Optical Cable

The novel uses of nanoparticles is not limited to thin films, other structures are anticipated, in one example, alternating refractive index nanoparticles are arranged in separate layers within the tubular structure to form a Bragg Reflective structure within a fiber optic cable. Such structures can optically separating wavebands, with the Distributed Bragg Array incorporated directly in the fiber optic cable. By photonically separating specific wavebands from within the fiber, solves the existing problem of costly & slow photo-electronic signal conversion, separating wavebands, and then re-emitting by laser-diode.

In one exemplary embodiment as illustrated per FIG. 46, the particles are introduced into fiber optic drawing process, arranged in order of refractive index so as to create a Bragg filter for the color being converted by the color converting element ahead, i.e. to ensure no back-propagations of the converted signals.

Imaging Sensors

The application of nanophosphors to imaging sensors in the X-Ray and UV is particularly exciting combination of thinness and high-loading capability. One of the issues in the past has been the difficulty in achieving high resolution (cost-effectively) using standard Si and Ge processes. Using nanoparticles provides for higher density and higher resolution that could be achievable by other methods.

QD's have been used for image sensors configured in the photo-diode or photo-voltaic mode of operation (creating an electron charge in response to excitation from a photon), but they are not as robust in the presence of high-energy x-rays.

Robust phosphors have been very commonly used for scintillators (emit visible or near visible light in response to gamma, x-ray photon). Nanophosphors provide additional versatility in meeting these requirements. In capturing either invisible or visible spectrum it is anticipated that different nanophosphors are selected according to their band gap and ability to produce an electric charge from excitation by different wavelength bands. Alternative embodiments as per FIG. 47, may use a color filter (e.g. Beyer pattern) to filter the incoming light into a monochromatic sensor.

BRIEF DESCRIPTION OF THE DRAWINGS

FIG. 1 is an illustration depicting the prior art of MicroLED with Color Conversion Layers FIG. 2 is an illustration depicting typical phosphor grinding process FIG. 3 is an illustration depicting typical phosphor particles, at initial time the average particle size is 40 um FIG. 4 is an illustration depicting analysis of the Nanoparticles from the described methods, with majority size less than 100 nm FIG. 5 is an illustration depicting an example High-Speed Ball Milling processes FIG. 6 is an illustration depicting embodiments of a Bulk Nanoparticle Sorting Apparatus FIG. 7 is an illustration depicting a phase array color filter formed from an waveguide arranged out of functional nanoparticles FIG. 8 is an illustration depicting 1D, 2D & 3D Bragg Diffraction structures from alternating refractive index materials (n1, n2)

FIG. 9 is an illustration depicting a Bragg Reflector formed from functional nanoparticle layers FIG. 10 is an illustration depicting a multi-modal light assembly package with differential die placement FIG. 11 is an illustration depicting stacked spin-coated substrates FIG. 12 is an illustration depicting microscope views of nanopatterned optical films, using red nanophosphor in SU-8

FIG. 13 is an illustration depicting nanopatterned optical film, using red nanophosphor in SU-8

FIG. 14 is an illustration depicting a patterned film incorporating Nanophosphor Particles FIG. 15 is an illustration depicting a functional nanopatterned film Layers FIG. 16 is an illustration depicting a functional nanopatterned film Layers FIG. 17 is an illustration depicting a patterning on cover substrate FIG. 18 is an illustration depicting mounting the patterned layer on the MicroLED FIG. 19 is an illustration depicting a reduction into practice of nanopatterning with nanophosphor materials (VividColor NanoBright)

FIG. 20 is an illustration depicting a "Highly-Functional Layered Thin-Film" constructed from Nanopatterned Materials FIG. 21 is an illustration depicting nanopatterning with nanomaterials FIG. 22 is an illustration depicting an assembly of nanopatterned filter/polarizer/collimators using patterned color-particles FIG. 23 is an illustration depicting a display with nanopatterned emissive waveguide filter/polarizer/collimator layer FIG. 24 is an illustration depicting an electro-luminescent Display based on Cyan and optional Blue FIG. 25 is an illustration depicting an electro-luminescent Display based on Cyan and optional Blue FIG. 26 is an illustration depicting an electro-luminescent Display based on Cyan Excitations FIG. 27 is an illustration depicting an electro-luminescent Display based on White Excitations FIG. 28 is an illustration depicting a high-functionality film Electro-Luminescent Display Backlight FIG. 29 is an illustration depicting a high-functionality film Electro-Luminescent Display Backlight FIG. 30 is an illustration depicting an electroluminescent NP-LED pixel with B-C-G-Y-R-W sub-elements FIG. 31 is an illustration depicting square and hexagonal sub-pixel structured NanoParticle-LED FIG. 32 is an illustration depicting a multi-layer MicroLED with functional ray steering surface structures FIG. 33 is an illustration depicting a "batwing" diffuser layer on-top-of a MicroLED FIG. 34 is an illustration depicting LED 3D light projector and SLCS (right) surface light collimating structure FIG. 35 is an illustration depicting a prior are TIR ePaper display, wherein a TFT field moves particles that interfere with the "Total Internal Reflection" to effect a change in a pixel's light reflection/absorption FIG. 36 is an illustration depicting prior art electrophoretic ePaper based on moving monochromatic (light-absorbing/reflective) ink particles in a microcapsule in an electric field FIG. 37 is an illustration depicting an electrophoretic ePaper display with YAG White LED FIG. 38 is an illustration depicting an eye-safe frontlit emissive ePaper color display (without ambient light filter)

FIG. 39 is an illustration depicting nanophosphors in an electrophoretic display configuration FIG. 40 is an illustration depicting an eye-safe frontlit emissive ePaper color display FIG. 41 is an illustration depicting an eye-safe emissive color ePaper display based on TIR mode FIG. 42 is an illustration depicting a solar cell comprising a nanoparticle conversion layer FIG. 43 is an illustration depicting a solar cell comprising a nanoparticle functional meta-material layer FIG. 44 is an illustration depicting a solar cell comprising a nanophosphor band-gap FIG. 45 is an illustration depicting a tandem solar cell using Nanophosphor and Silicon Cell FIG. 46 is an illustration depicting a fiber-optic cable with color-converting material in distributed Bragg Grating FIG. 47 is an illustration depicting an Image sensor pixel using nanophosphor band-gap

POST-SCRIPT

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A functional light-converting meta-material apparatus, comprising a layer of suspension matrix, wherein the suspension layer has a thickness of less than 25 um, and wherein the suspension matrix comprises color converting nanoparticles;

wherein at least one of said nanoparticles is configured to emit a non-blue photon of light responsive to stimulation of blue photon of light, wherein a monolayer of the color converting nanoparticles comprises a minimum thickness of 1 nanoparticle, wherein the nanoparticles in the monolayer form a uniform layer such that an average distance between neighboring particles is generally uniform and consistent with the largest dimension of a largest nanoparticle present in the suspension; and, wherein a resist material and the suspension are formed, via nanopatterning, into a functional material structure, creating optical functionality in addition to the materials inherent color conversion functionality.

2. The apparatus of claim 1, further comprising at least one photo-lithography resist material selected from a set of nanoparticles including: NIR photo-resist, UV photo-resist, chemical-resist and thermal-resist.

3. The apparatus of claim 1, further comprising at least one nanoparticle selected from a set of nanoparticles consisting of: nanophosphors, quantum dots, photo-dispersing nanoparticles, photo-refractive nanoparticles, and conductive particles.

4. The apparatus of claim 1, wherein a process of forming the functional material structure is one selected from a group consisting of: nanolithographic transfer, and photo-lithographic transfer.

5. A color converting apparatus comprising:
a suspension matrix comprising color converting nanoparticles,
wherein the color converting nanoparticles are configured to emit a photon of a second wavelength responsive to stimulation by a photon of a first wavelength,
wherein the suspension matrix comprises a layer having a thickness of less than 25 μm, and
wherein the color converting nanoparticles in the layer are configured in a uniform distribution, wherein an average distance dimension between neighboring nanoparticles is substantially equal to a largest dimension of a largest nanoparticle present in the suspension matrix.

6. The color converting apparatus of claim 5 wherein said color converting nanoparticles comprise a nanophosphor.

7. The color converting apparatus of claim 5 wherein said color converting nanoparticles comprise a quantum dot.

8. The color converting apparatus of claim 5 wherein said color converting nanoparticles comprise a photo-dispersing nanoparticle.

9. The color converting apparatus of claim 5 wherein said color converting nanoparticles comprise a photo-refractive nanoparticle.

10. The color converting apparatus of claim 5 wherein said color converting nanoparticles comprise a conductive particle.

11. The color converting apparatus of claim 5 further comprising a photo-lithography resist material, patterned into a structure having optical functionality independent of a color converting function of said nanoparticles.

12. The color converting apparatus of claim 11 wherein said structure comprises a diffuser.

13. The color converting apparatus of claim 11 wherein said structure comprises a diffraction grating.

14. The color converting apparatus of claim 11 wherein said structure comprises a Brag filter.

15. The color converting apparatus of claim 11 wherein said structure comprises a prismatic light-turning structure.

16. The color converting apparatus of claim 15 wherein said structure is etched via a laser.

17. The color converting apparatus of claim 11 wherein said photo-lithography resist material comprises a UV curable photo-resist.

18. The color converting apparatus of claim 11 wherein said photo-lithography resist material comprises an infrared (IR) curable photo-resist.

19. The color converting apparatus of claim 11 wherein said photo-lithography resist material comprises a near-infrared (NIR) curable photo-resist.

20. The color converting apparatus of claim 5 wherein said etching independent of a mask.

* * * * *